(12) United States Patent
Shimazawa et al.

(10) Patent No.: US 7,974,048 B2
(45) Date of Patent: Jul. 5, 2011

(54) MAGNETO-RESISTIVE EFFECT DEVICE OF CPP TYPE HAVING SHIELD LAYERS COUPLED WITH FERROMAGNETIC LAYERS

(75) Inventors: Koji Shimazawa, Tokyo (JP); Daisuke Miyauchi, Tokyo (JP); Yoshihiro Tsuchiya, Tokyo (JP); Takahiko Machita, Tokyo (JP); Shinji Hara, Tokyo (JP)

(73) Assignee: TDK Corporation, Tokyo (JP)

( * ) Notice: Subject to any disclaimer, the term of this patent is extended or adjusted under 35 U.S.C. 154(b) by 840 days.

(21) Appl. No.: 11/946,358

(22) Filed: Nov. 28, 2007

(65) Prior Publication Data
US 2009/0135529 A1   May 28, 2009

(51) Int. Cl.
*G11B 5/39* (2006.01)
(52) U.S. Cl. .............. 360/319; 360/324.11; 360/324.12; 360/324.2
(58) Field of Classification Search .................. 360/319, 360/324.1, 324.11, 324.12, 324.2
See application file for complete search history.

(56) References Cited

U.S. PATENT DOCUMENTS

| 6,169,647 | B1 | 1/2001 | Mao et al. | |
|---|---|---|---|---|
| 6,876,524 | B2 * | 4/2005 | Tagawa et al. | 360/324.12 |
| 7,426,096 | B2 * | 9/2008 | Shimazawa et al. | 360/319 |
| 7,805,828 | B2 * | 10/2010 | Shimazawa et al. | 29/603.08 |
| 2005/0094321 | A1 * | 5/2005 | Ju et al. | 360/319 |
| 2007/0201166 | A1 * | 8/2007 | Gill | 360/319 |
| 2007/0211391 | A1 | 9/2007 | Hirata et al. | |
| 2009/0296283 | A1 * | 12/2009 | Mizuno et al. | 360/319 |
| 2010/0027168 | A1 * | 2/2010 | Chou et al. | 360/319 |
| 2010/0053820 | A1 * | 3/2010 | Miyauchi et al. | 360/319 |

FOREIGN PATENT DOCUMENTS

| JP | 2005-302938 | 10/2005 |
|---|---|---|
| JP | 2005-347512 | 12/2005 |

OTHER PUBLICATIONS

U.S. Appl. No. 12/112,598, filed Apr. 30, 2008, Hara, et al.
U.S. Appl. No. 12/019,202, filed Jan. 24, 2008, Machita, et al.
U.S. Appl. No. 12/019,205, filed Jan. 24, 2008, Machita, et al.

* cited by examiner

*Primary Examiner* — Jefferson Evans
(74) *Attorney, Agent, or Firm* — Oblon, Spivak, McClelland, Maier & Neustadt, L.L.P.

(57) ABSTRACT

The invention provides a magneto-resistive effect device of the CPP (current perpendicular to plane) structure, having a magneto-resistive effect unit, and a first shield layer and a second shield layer located and formed such that the magneto-resistive effect unit is sandwiched between them, with a sense current applied in a stacking direction.

11 Claims, 15 Drawing Sheets

MAGNETO-RESISTIVE EFFECT DEVICE OF CPP TYPE HAVING SHIELD LAYERS COUPLED WITH FERROMAGNETIC LAYERS

BACKGROUND OF THE INVENTION

1. Field of the Invention

The present invention relates to a magneto-resistive effect device adapted to read the magnetic field intensity of magnetic recording media or the like as signals, and a thin-film magnetic head comprising that magneto-resistive effect device as well as a head gimbal assembly and a magnetic disk system including that thin-film magnetic head.

2. Explanation of the Prior Art

In recent years, with an increase in the recording density of hard disks (HDDs), there have been growing demands for improvements in the performance of thin-film magnetic heads. For the thin-film magnetic head, a composite type thin-film magnetic head has been widely used, which has a structure wherein a reproducing head having a read-only magneto-resistive effect device (hereinafter often called the MR device for short) and a recording head having a write-only induction type magnetic device are stacked together.

The magneto-resistive effect device (CIP-GMR device) of the so-called CIP (current in plane) structure that operates on currents flowing parallel with the film plane of the device—called a spin valve GMR device—is now widely employed as the reproducing head. The spin valve GMR device of such structure is positioned between upper and lower shield layers each formed of a soft magnetic metal film, and sandwiched between insulating layers called gap layers. Recording density in the bit direction is determined by the gap (reproducing gap) between the upper and lower shield layers.

With an increase in the recording density, there has been a growing demand for narrower shield gaps and narrower tracks. As the reproducing head track grows narrow with a decreasing device height, so does the device area; however, with the prior art structure, there is an operating current limited from the standpoint of reliability, because there is heat dissipation efficiency decreasing with a decreasing area.

To solve such a problem, there is a GMR device of the CPP (current perpendicular to plane) structure (CPP-GMR device) proposed in the art, in which upper and lower shield layers and a magneto-resistive effect device are connected electrically in series to make do without any insulating layer between the shields. This technology is thought of as inevitable to achieve such recording densities as exceeding 200 Gbits/in$^2$.

Such a CPP-GMR device has a multilayer structure comprising a first ferromagnetic layer and a second ferromagnetic layer between which an electroconductive, nonmagnetic intermediate layer is sandwiched from both its sides. A typical multilayer structure for the spin valve type CPP-GMR device comprises, in order from a substrate side, a lower electrode/antiferromagnetic layer/first ferromagnetic layer/electroconductive, nonmagnetic intermediate layer/second ferromagnetic layer/upper electrode stacked together in order.

The direction of magnetization of the first ferromagnetic layer that is one of the ferromagnetic layers remains fixed such that when an externally applied magnetic field is zero, it is perpendicular to the direction of magnetization of the second ferromagnetic layer. The fixation of the direction of magnetization of the first ferromagnetic layer is achieved by the exchange coupling of it with an antiferromagnetic layer provided adjacent to it, whereby unidirectional anisotropic energy (also called the "exchange bias" or "coupled magnetic field") is applied to the first ferromagnetic layer. For this reason, the first ferromagnetic layer is also called the fixed magnetization layer. By contrast, the second ferromagnetic layer is also called the free layer. Further, if the fixed magnetization layer (the first ferromagnetic layer) is configured as a triple-layer structure of a ferromagnetic layer/nonmagnetic metal layer/ferromagnetic layer (the so-called "multilayer ferri-structure" or "synthetic pinned layer"), it is then possible to give a strong exchange coupling between both ferromagnetic layers thereby effectively increasing the exchange coupling force from the antiferromagnetic layer, and to reduce influences on the free layer of a static magnetic field resulting from the fixed magnetization layer. Thus, the "synthetic pinned structure" is now in extensive use.

However, a further slimming-down of the magneto-resistive effect device is in great need so as to meet recent demands for ultra-high recording density. Such being the case, there is a novel GMR device structure put forward, which has a basic structure comprising a simple triple-layer arrangement of ferromagnetic layer (free layer)/nonmagnetic intermediate layer/ferromagnetic layer (free layer), as set forth typically in publication 1 (IEEE TRANSACTION ON MAGNETICS, VOL. 43, NO. 2, FEBRUARY, pp. 645-650 as well as U.S. Pat. Nos. 7,019,371B2 or 7,035,062B1.

For convenience, such structure is here called the dual free layer (DFL) device structure. In the DFL device structure, the two ferromagnetic layers are exchange coupled together such that their magnetizations are anti-parallel with each other. And under the action of a bias magnetic field given out of a magnet located in a depth position opposite to the ABS corresponding to the surface of the device facing a medium, there is an initial state created in which the magnetizations of two magnetic layers (free layers) are inclined about 45° with respect to the track width direction. Upon detection of a signal magnetic field from the medium in the initial state of the device, the directions of magnetization of the two magnetic layers change as if scissors cut paper, with the result that there is a change in the resistance value of the device.

When such a DFL device structure is applied to the so-called TMR or CPP-GMR device, it is possible to make the gap (read gap length) between the upper and lower shield layers much narrower as compared with a conventional, ordinary spin valve type CPP-GMR device. Specifically, it is possible to make do without the aforesaid antiferromagnetic layer that is needed for the ordinary spin valve type CPP-GMR device as well as the ferromagnetic layers of the aforesaid "synthetic pinned structure". As a result, the "read gap layer" that has been said to be 30 nm at the very most can be reduced down to 20 nm or less.

A requirement for the formation of the prior art DFL device structure is that, as already noted, the two ferromagnetic layers (free layers) are exchange coupled together such that their magnetizations are mutually anti-parallel. Such a conventional basic structure is easily achievable by inserting Au, Ag, Cu, Ir, Rh, Ru, Cr or other noble metal between the two ferromagnetic layers (free layers) to generate an exchange coupling between them.

A problem with the TMR device, however, is that an insulating film such as an aluminum oxide (AlOx) or magnesium oxide (MgO) film must be interposed between the two ferromagnetic layers (free layers), leading to the inability to obtain any strong exchange coupling between them. As a result, there is much difficulty in the antiparallel coupling between the two ferromagnetic layers (free layers). Also, there is a technique known in the art (for instance, JP(A) 2004-165254, JP Patent No. 3625199, JP(A) 2002-208744), in which a NOL (nano-oxide-layer) is partially inserted between the two ferromagnetic layers (free layers) thereby boosting up the output of the CPP-GMR device. However, this technique cannot immediately be used because of the risk of the antiferromagnetic exchange coupling of the two ferromagnetic layers (free layers) growing very weak or vanishing off.

Further, U.S. Pat. No. 6,169,647B1 shows a technique of using two antiferromagnetic material layers to place the magnetizations of two ferromagnetic layers (free layers) in an antiparallel state (see FIG. 3 in particular). To make viable the structure according to this proposal, however, the antiferromagnetic material layers must each have a thickness of at least 5 nm that is contradictory to the purpose of curtailing the "read gap length". Another requirement is that the directions of exchange coupling generated from the two antiferromagnetic material layers be antiparallel with each other, rendering heat treatment (annealing) for achieving that very difficult. As device size gets narrow and small, it causes a decrease in the number of particles forming the antiferromagnetic material layers and, hence, renders the so-called pinning action erratic (or insufficient), giving rise to inconvenience responsible for erratic performance.

The situations being like this, the present invention has been made for the purpose of providing a novel magneto-resistive effect device that makes it to achieve an antiparallel magnetization state for two ferromagnetic layers (free layers) with simple structure yet without being restricted by the material and specific structure of an intermediate film interposed between the two ferromagnetic layers (free layers), that makes it possible to improve on linear recording densities by the adoption of a structure capable of making the "read gap length" (the gap between the upper and lower shield layers) short (narrow) thereby meeting recent demands for ultra-high recording densities, and that makes it possible to obtain stable magneto-resistive effect changes so that much higher reliability is achievable.

SUMMARY OF THE INVENTION

According to the present invention, the aforesaid object is accomplished by the provision of a magneto-resistive effect device of the CPP (current perpendicular to plane) structure, comprising a magneto-resistive effect unit, and a first shield layer and a second shield layer located and formed such that the magneto-resistive effect unit is sandwiched between them, with a sense current applied in the stacking direction, wherein said magneto-resistive effect unit comprises a nonmagnetic intermediate layer, and a first ferromagnetic layer and a second ferromagnetic layer stacked and formed such that said nonmagnetic intermediate layer is interposed between them; said first shield layer, and said second shield layer is controlled by magnetization direction control means in terms of magnetization direction; and said first ferromagnetic layer, and said second ferromagnetic layer receives action such that there is an antiparallel magnetization state created, in which mutual magnetizations are in opposite directions, under the influences of magnetic actions of said first shield layer and said second shield layer.

In a preferable embodiment of the invention, said first ferromagnetic layer is magnetically coupled to said first shield layer having a controlled magnetization direction indirectly via a first exchange coupling function gap layer, and said second ferromagnetic layer is magnetically coupled to said second shield layer having a controlled magnetization direction indirectly via a second exchange coupling function gap layer.

In a preferable embodiment of the invention, said first exchange coupling function gap comprises, in order from said first shield layer side, an exchange coupling transfer layer, a gap adjustment layer, and an exchange coupling adjustment layer, and said first exchange coupling function gap layer comprises, in order from said second shield layer side, an exchange coupling transfer layer, a gap adjustment layer, and an exchange coupling adjustment layer.

In a preferable embodiment of the invention, said exchange coupling transfer layer is made up of at least one material selected from the group consisting of Ru, Rh, Ir, Cr, Cu, Ag, Au, Pt, and Pd, said gap adjustment layer is made up of a ferromagnetic material, and said exchange coupling adjustment layer is made up of at least one material selected from the group consisting of Ru, Rh, Ir, Cr, Cu, Ag, Au, Pt, and Pd.

In a preferable embodiment of the invention, the magnetization direction control means for controlling the magnetization direction of said first shield layer, and said second shield layer is defined by a shape anisotropy function of said first shield layer, and said second shield layer, or an exchange coupling function from an antiferromagnetic material.

In a preferable embodiment of the invention, said first shield layer, and said second shield layer is allowed to have a single domain structure by said magnetization direction control means.

In a preferable embodiment of the invention, said first exchange coupling function gap layer comprises, in order from said first shield layer side, an exchange coupling transfer layer, a gap adjustment layer, an exchange coupling transfer layer, a gap adjustment layer, and an exchange coupling adjustment layer, and said second exchange coupling function gap layer comprises, in order from said second shield layer side, an exchange coupling transfer layer, a gap adjustment layer, an exchange coupling transfer layer, a gap adjustment layer, and an exchange coupling adjustment layer.

In a preferable embodiment of the invention, said nonmagnetic intermediate layer is made up of a triple-layer structure with ZnO located at the middle thereof.

The invention also provides a thin-film magnetic head comprising a plane in opposition to a recording medium, and a magneto-resistive effect as recited in claim 1, that is located near said medium opposite plane to detect a signal magnetic field from said recording medium.

Further, the invention provides a head gimbal assembly comprising a slider including the aforesaid thin-film magnetic head and located in such a way as to oppose to a recording medium, and a suspension adapted to resiliently support said slider.

Furthermore, the invention provides a magnetic disk system comprising a slider including the aforesaid thin-film magnetic head and located in such a way as to oppose to a recording medium, and a positioning device adapted to support and position said slider with respect to said recording medium.

DETAILED EXPLANATION OF THE PREFERRED EMBODIMENTS

Figure 1:
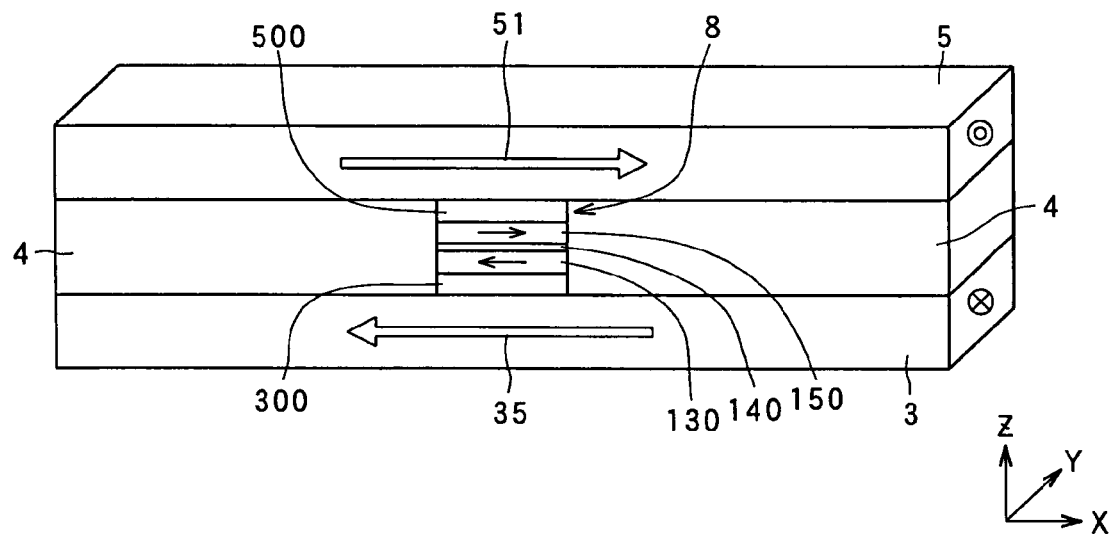
FIG. 1 is illustrative in perspective of the magneto-resistive effect device according to an embodiment of the invention, as viewed from the ABS (air bearing surface).

The best mode for carrying out the invention is now explained in greater details.

The magneto-resistive effect device of the invention is preferably used with a thin-film magnetic head in general, and its reproducing head in particular.

In the following disclosure of the invention, the sizes of each device component in the X-, Y- and Z-axis directions shown in the drawings will be referred to as the "width", "length" and "thickness", respectively. The side of the device nearer to the air bearing surface (the plane of the thin-film magnetic head in opposition to the recording medium) in the Y-axis direction will be called "forward" and the opposite side (depth-wise side) will be called "rearward", and the direction of stacking the individual films up will be called "upward" or "upper side" and the opposite direction will be called "downward" or "lower side".

FIG. 1 is illustrative in perspective of the magneto-resistive effect device according to an embodiment of the invention, as viewed from the ABS (air bearing surface). The ABS is generally corresponding to a plane (hereinafter often called the medium opposite plane) at which the device lies in opposition to the recording medium; however, it is understood that the ABS here includes even a section at a position where the multilayer structure of the device can be clearly observed. For instance, a protective layer of DLC (the protective layer adapted to cover the device) or the like, in a strict sense, positioned facing the medium opposite plane may be factored out, if necessary.

Figure 2:
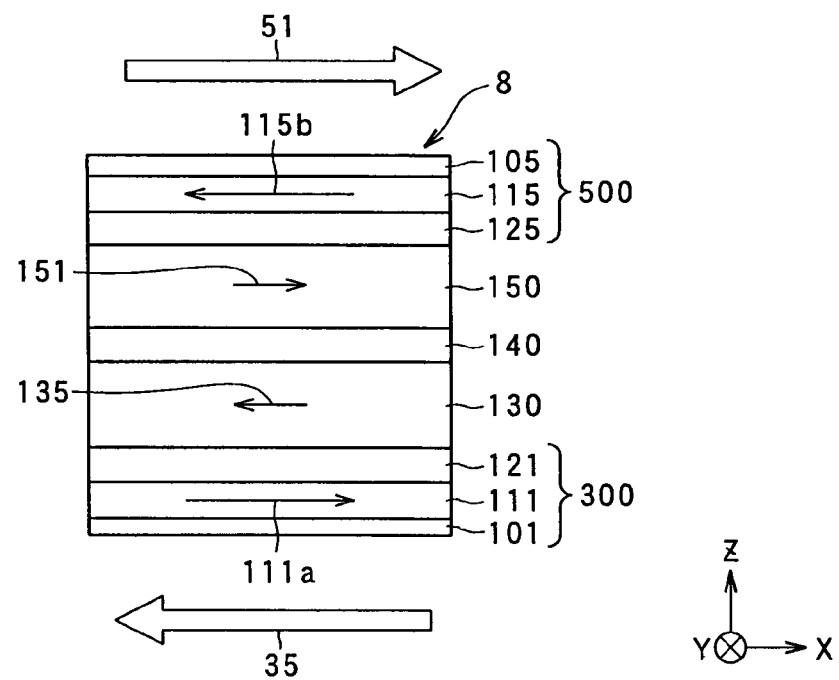
FIG. 2 is an enlarged schematic view of the magneto-resistive effect unit of the magneto-resistive effect device of FIG. 1 including a sensor area.

FIG. 2 is an enlarged schematic view of the magneto-resistive effect unit of the magneto-resistive effect device including a sensor area.

Figure 3:
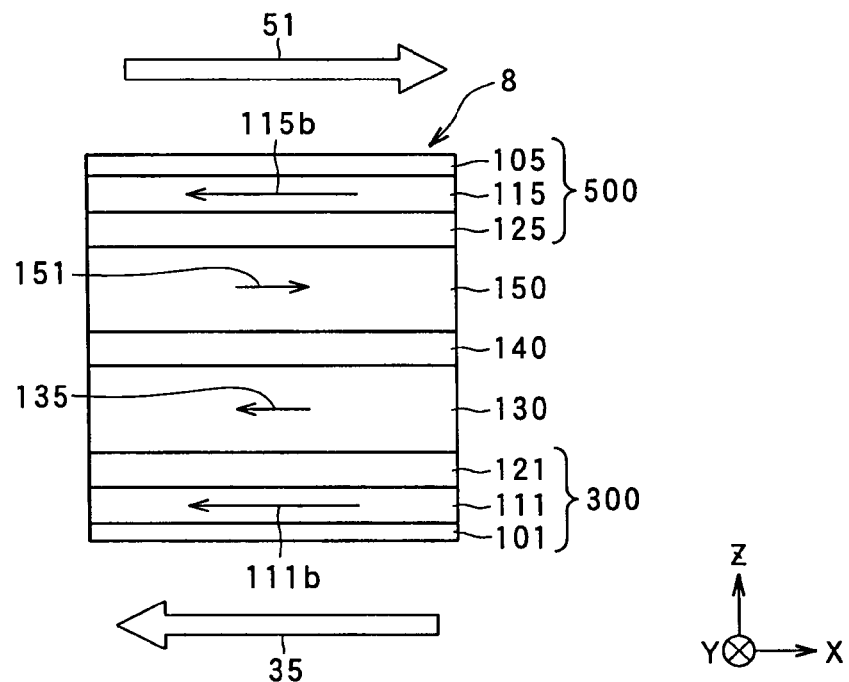
FIG. 3 is illustrative of, as in FIG. 2, of a modification to the construction of the magneto-resistive effect unit.
Figure 4:
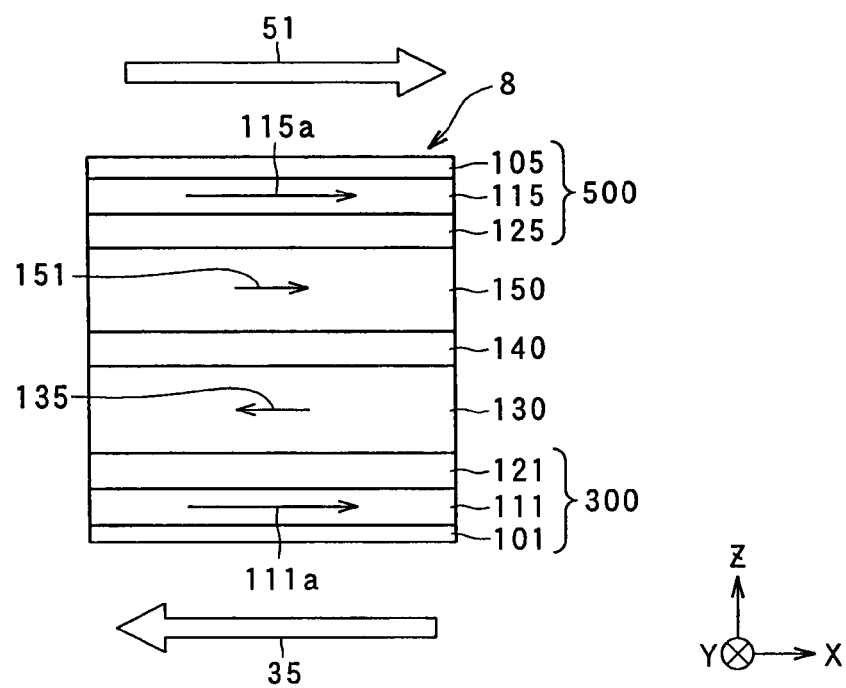
FIG. 4 is illustrative of, as in FIG. 2, of another modification to the construction of the magneto-resistive effect unit.
Figure 5:
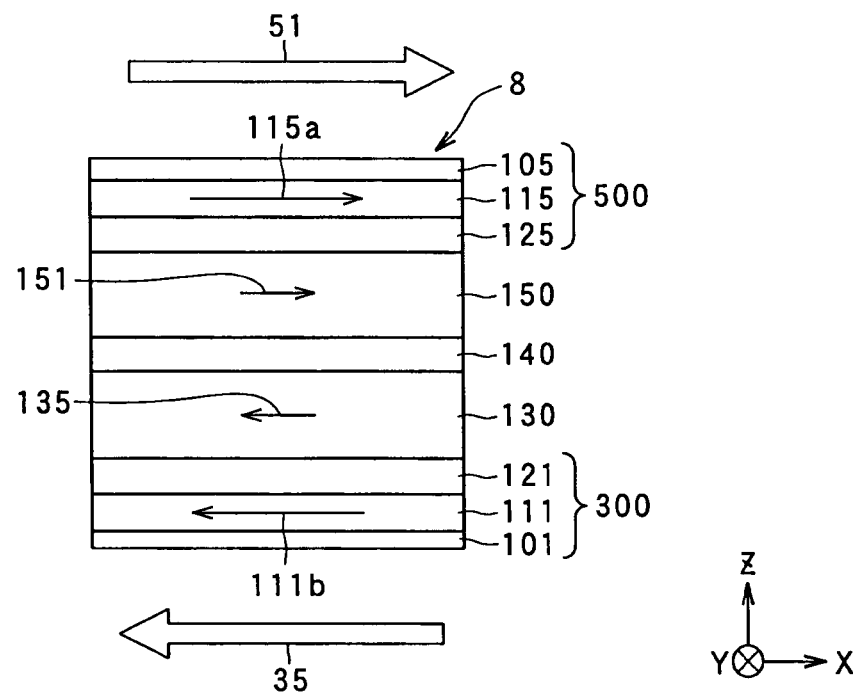
FIG. 5 is illustrative of, as in FIG. 2, of yet another modification to the construction of the magneto-resistive effect unit.

FIGS. 3, 4 and 5 are each illustrative, as in FIG. 2, of a modification to the magneto-resistive effect unit.

[Explanation of the Structure of the Magneto-Resistive Effect Device]

As shown in FIG. 1, the magneto-resistive effect device of the invention comprises a magneto-resistive effect unit 8, and a first shield layer 3 (also called the lower shield layer 3) and a second shield layer 5 (also called the upper shield layer 5) which are formed and located such that the magneto-resistive effect unit 8 is substantially sandwiched between them. And the magneto-resistive effect device of the invention is a magneto-resistive effect device of the CPP (current perpendicular to plane) structure with a sense current applied in the stacking direction of the magneto-resistive effect unit 8.

The first shield layer 3 and the second shield layer 5 are each controlled by magnetization direction control means in terms of the direction of magnetization. In the embodiment shown in FIG. 1, the first shield layer 3 has magnetization fixed in the minus widthwise direction (−X direction) from the right to the left side of the paper. By contrast, the second shield layer 5 has magnetization fixed in the plus widthwise direction (+X direction) from the left to the right side of the paper.

The magneto-resistive effect unit 8 comprises a non-magnetic intermediate layer 140, and a first ferromagnetic layer 130 and a second ferromagnetic layer 150 that are stacked and formed with the nonmagnetic intermediate layer 140 sandwiched between them. A multilayer structure defined by the first ferromagnetic layer 130, the nonmagnetic intermediate layer 140 and the second ferromagnetic layer 150 is a sensor area, and has a total thickness of about 10 to 20 nm.

Of these, the first ferromagnetic layer 130, and the second ferromagnetic layer 150 functions as a so-called free layer having its magnetization direction changing in response to an external magnetic field.

The feature of the invention (part of the invention) is that the first and second ferromagnetic layers are going to receive such action that there is an anti-parallel magnetization state created, wherein their mutual magnetization directions are opposite to each other, under the magnetic influences of the first and second shield layers. It is here noted that the wording "receive such action that there is an antiparallel magnetization state created" is used to factor in the fact that a practically used device has the first and second ferromagnetic layers magnetized in substantially orthogonal directions by the application of a bias magnetic field.

To achieve the aforesaid advantage of the invention, a first exchange coupling function gap layer 300 is interposed between the first shield layer 3 and the first ferromagnetic layer 130, and a second exchange coupling function gap layer 500 is interposed between the second shield layer 5 and the second ferromagnetic layer 150. In short, the first ferromagnetic layer 130 is magnetically coupled indirectly via the first exchange coupling function gap layer 300 to the first shield layer 3 having a controlled magnetization direction, and the second ferromagnetic layer 150 is magnetically coupled indirectly via the second exchange coupling function gap layer 500 to the second shield layer 5 having a controlled magnetization direction.

These components of the invention are now each described in greater details.

(Explanation of the First Shield Layer 3 and the Second Shield Layer 5)

In the invention, the first shield layer 3, and the second shield layer 5 has functions:

(1) a function of shielding off magnetism from an external magnetic field, (2) an electrode function, and (3) a function of giving magnetic action to the first 130 and the second ferromagnetic layer 150 such that there is an antiparallel magnetization state created in which their magnetization directions are opposite to each other.

The aforesaid functions (1) and (2) have already been known in the art, and the function (2) is not always needed, because of being achievable by a separately added another electrode layer. In the invention, it is the function (3) that is particularly noteworthy.

To let the aforesaid function (3) take effect, the first shield layer 3, and the second shield layer 5 has its magnetization direction controlled by the magnetization direction control means, as noted above.

In the embodiment shown in FIG. 1, the first shield layer 3 has its magnetization fixed in the minus widthwise direction (−X direction) from the right to the left side of the paper. By contrast, the second shield layer 5 has its magnetization direction fixed in the plus widthwise direction (+X direction) from the left to the right side of the paper.

In other words, the first shield layer 3, and the second shield layer 5 is constructed in such a way as to have a single domain structure through the magnetization direction control means. It is here noted that the first 3 and the second shield layer 5 may have magnetization directions opposite to those shown in FIG. 1.

For instance, the magnetization direction control means here may include (1) a method of making use of shape anisotropy with which the first, and the second shield layer is configured in given shape and size, and (2) a method in which an antiferromagnetic material is joined to and combined with the first, and the second shield layer so that magnetization is fixed by the antiferromagnetic material in place. In short, the first 3, and the second shield layer 5 is constructed in such a way as to have a single domain structure by shape anisotropy or exchange coupling from the antiferromagnetic material.

For the magnetization direction control means, particular preference is given to the aforesaid method (1) in which the single domain structure is obtained making use of shape anisotropy. In view of magnetization stability, it is then preferable that the magnetization direction 35 of the first shield layer 3 and the magnetization direction 51 of the second shield layer 5 are set antiparallel with each other, as shown in FIG. 1.

To allow the first 3, and the second shield layer 5 to have a single domain structure using shape anisotropy, the first 3, and the second shield layer 5 has a longitudinal (X direction) length of typically about 30 μm, and a depth (Y direction) length of typically about 3 μm.

To obtain the single domain structure, the aspect (X/Y) ratio should desirously be 10 or greater.

The first 3, and the second shield layer 5, for instance, may be made of NiFe (permalloy), CoZrTa, sendust, NiFeCo, and CoZrNb.

The thickness (Z direction) should be typically about 20 nm to 3 μm.

(Explanation of the Magneto-Resistive Effect Unit 8)

As shown in FIG. 1, there is the magneto-resistive effect unit 8 interposed between the first 3 and the second shield layer 5. And on each side of the magneto-resistive effect unit 8 there is a nonmagnetic layer 4 made of alumina ($Al_2O_3$) or the like located to define the reading track width.

As shown in FIG. 1, the magneto-resistive effect unit 8 comprises a sensor area positioned at substantially the middle of the multilayer film and comprising the first ferromagnetic layer 130, nonmagnetic intermediate layer 140 and second ferromagnetic layer 150, and the first 300 and the second exchange coupling function gap layer 500 that are interposed between that sensor area, and the first 3 and the second shield layer 5, respectively.

Between the sensor area and the first shield layer 3, and between the sensor area and the second shield layer 5, there is a given gap corresponding to the recording density required. This is to make sure the capturing in the sensor area of only the external magnetic field as signals. As the gap grows larger than necessary, there is a risk of capturing not only the signal magnetic field but also adjacent other signal magnetic fields. Conversely, as the gap is way too smaller than the necessary distance, there is a risk of the signal magnetic field being drawn in the shield layers 3 and 5 surrounding the sensor area rather than in the sensor area.

It goes without saying that first 300 and the second exchange coupling function gap layer 500 must have such a gap function. Added to this in the invention, the first 300 and the second exchange coupling function gap layer 500 must be made up of such a multilayer structure as explained below for the purpose of letting the key function (characteristic function) of the invention show up.

Explanation of the First Exchange Coupling Function Gap Layer 300

The first exchange coupling function gap layer 300 comprises, in order from the side of the first shield layer 3, an exchange coupling transfer layer 101, a gap adjustment layer 111 and an exchange coupling adjustment layer 121. The gap adjustment layer 111 is a so-called ferromagnetic material layer made up of a ferromagnetic material.

The exchange coupling transfer layer 101 is made of at least one material selected from the group consisting of Ru, Rh, Ir, Cr, Cu, Ag, Au, Pt and Pd: it is capable of adjusting the strength of magnetic coupling of the magnetization 35 of the first shield layer 3 to the magnetization 111a of the gap adjustment layer 111 depending on what material is selected and what thickness it is set at. As the material to be used is determined and its thickness is set, the direction of the magnetization 111a of the gap adjustment layer 111 magnetically coupled to the magnetization 35 of the first shield layer 3 is also determined. To put it another way, whether there is antiferromagnetic coupling (where the magnetizations are magnetically coupled together in opposite directions) or ferromagnetic coupling (where the magnetizations are magnetically coupled together in the same direction) is determined.

The exchange coupling adjustment layer 121 is made of at least one material selected from the group consisting of Ru, Rh, Ir, Cr, Cu, Ag, Au, Pt and Pd: it is capable of adjusting the strength of magnetic coupling of the magnetization 111a of the gap adjustment layer 111 to the magnetization 135 of the first ferromagnetic layer 130 depending on what material is selected and what thickness it is set at. As the material to be used is determined and its thickness is set, the direction of the magnetization 135 of the first ferromagnetic layer 130 magnetically coupled to the magnetization 111a of the gap adjustment layer 111 is also determined. To put it another way, whether there is antiferromagnetic coupling or ferromagnetic coupling is determined.

The requirement for the invention is that the first ferromagnetic layer 130 functions as the so-called free layer that responds to the external magnetic field with high sensitivity. To this end, the first ferromagnetic layer 130 is set such that the strength of magnetic coupling of the magnetization 35 of the first shield layer 3 to the magnetization 111a of the gap adjustment layer 111 grows strong, and the strength of the magnetization 111a of the gap adjustment layer 111 to the magnetization 135 of the first ferromagnetic layer 130 gets relatively weak.

The first exchange coupling function gap 300 has a thickness set at about 1.5 to 6.0 nm.

Explanation of the Second Exchange Coupling Function Gap Layer 500

The second exchange coupling function gap layer 500 comprises, in order from the side of the second shield layer 5, an exchange coupling transfer layer 105, a gap adjustment layer 115 and an exchange coupling adjustment layer 125. The gap adjustment layer 115 is a so-called ferromagnetic material layer made up of a ferromagnetic material.

The exchange coupling transfer layer 105 is made up of at least one material selected from the group consisting of Ru, Rh, Ir, Cr, Cu, Ag, Au, Pt and Pd: it is capable of adjusting the strength of magnetic coupling of the magnetization 51 of the second shield layer 5 to the magnetization 115b of the gap adjustment layer 115 depending on what material is selected and what thickness it is set at. As the material to be used is determined and its thickness is set, the direction of the magnetization 115b of the gap adjustment layer 115 magnetically coupled to the magnetization 51 of the second shield layer 5 is also determined. To put it another way, whether there is antiferromagnetic coupling (where the magnetizations are magnetically coupled together in opposite directions) or ferromagnetic coupling (where the magnetizations are magnetically coupled together in the same direction) is determined.

The exchange coupling adjustment layer 125 is made up of at least one material selected from the group consisting of Ru, Rh, Ir, Cr, Cu, Ag, Au, Pt and Pd: it is capable of adjusting the strength of magnetic coupling of the magnetization 115b of the gap adjustment layer 115 to the magnetization 151 of the second ferromagnetic layer 150 depending on what material is selected and what thickness it is set at. As the material to be used is determined and its thickness is set, the direction of the magnetization 151 of the second ferromagnetic layer 150 magnetically coupled to the magnetization 115b of the gap adjustment layer 115 is also determined. To put it another way, whether there is antiferromagnetic coupling or ferromagnetic coupling is determined.

The requirement for the invention is that the second ferromagnetic layer 150 functions as the so-called free layer that responds to the external magnetic field with high sensitivity. To this end, the second ferromagnetic layer 150 is set such that the strength of magnetic coupling of the magnetization 51 of the second shield layer 5 to the magnetization 115b of the gap adjustment layer 115 grows strong, and the strength of the magnetization 115b of the gap adjustment layer 115 to the magnetization 151 of the second ferromagnetic layer 150 gets relatively weak.

The second exchange coupling function gap 500 has a thickness set at about 1.5 to 6.0 nm.

Explanation of the Adjustment of the Strength of Magnetic Coupling (the Strength of the Exchange Coupled Magnetic Field)

The adjustment of the strength of magnetic coupling (the strength of the exchange coupled magnetic field) is now explained with reference to FIGS. 8 and 9.

Figure 8:
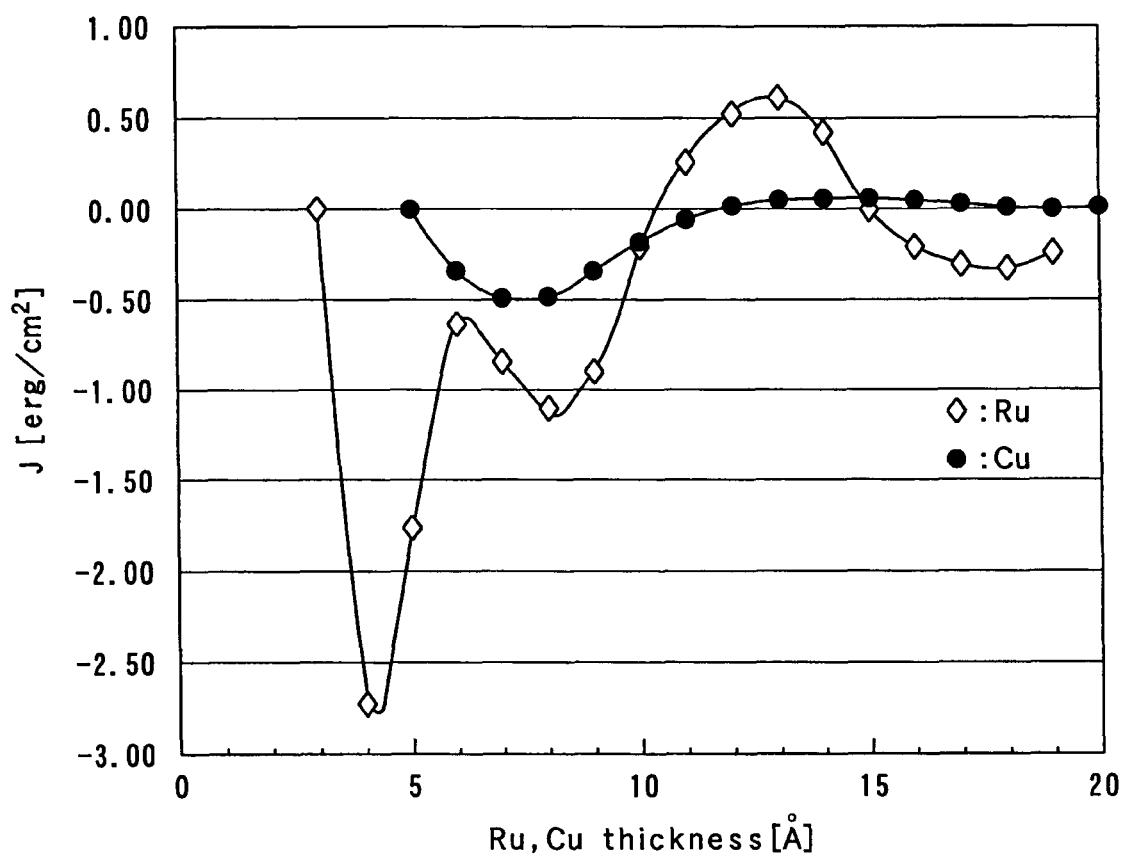
FIG. 8 is a graph indicative of the thickness t (Å) of Ru and Cu vs. the exchange coupled magnetic field strength J (erg/cm$^2$) in the event that Ru and Cu are used as the materials to form the exchange coupling transfer layer 101, 105 and the exchange coupling adjustment layer 121, 125.

FIG. 8 is a graph indicative of the thickness t (Å) of Ru and Cu vs. the exchange coupled magnetic field strength J (erg/cm$^2$) in the event that Ru and Cu are used for the materials forming the exchange coupling transfer layer 101, 105 and the exchange coupling adjustment layer 121, 125. This graph has been prepared using a Co$_{90}$Fe$_{10}$ alloy for the magnetic material subjected to exchange coupling with Ru or Cu held in place. FIG. 9 is a graph indicative of the Cu thickness t (Å) vs. the exchange coupled magnetic field strength J (erg/cm$^2$): it is basically and substantially the same as the graph of FIG. 8 concerning Cu. In particular, however, the scale span for the exchange coupled magnetic field strength J (erg/cm$^2$) indicated on ordinate is enlarged for an easy understanding of fluctuations on ordinate.

Figure 9:
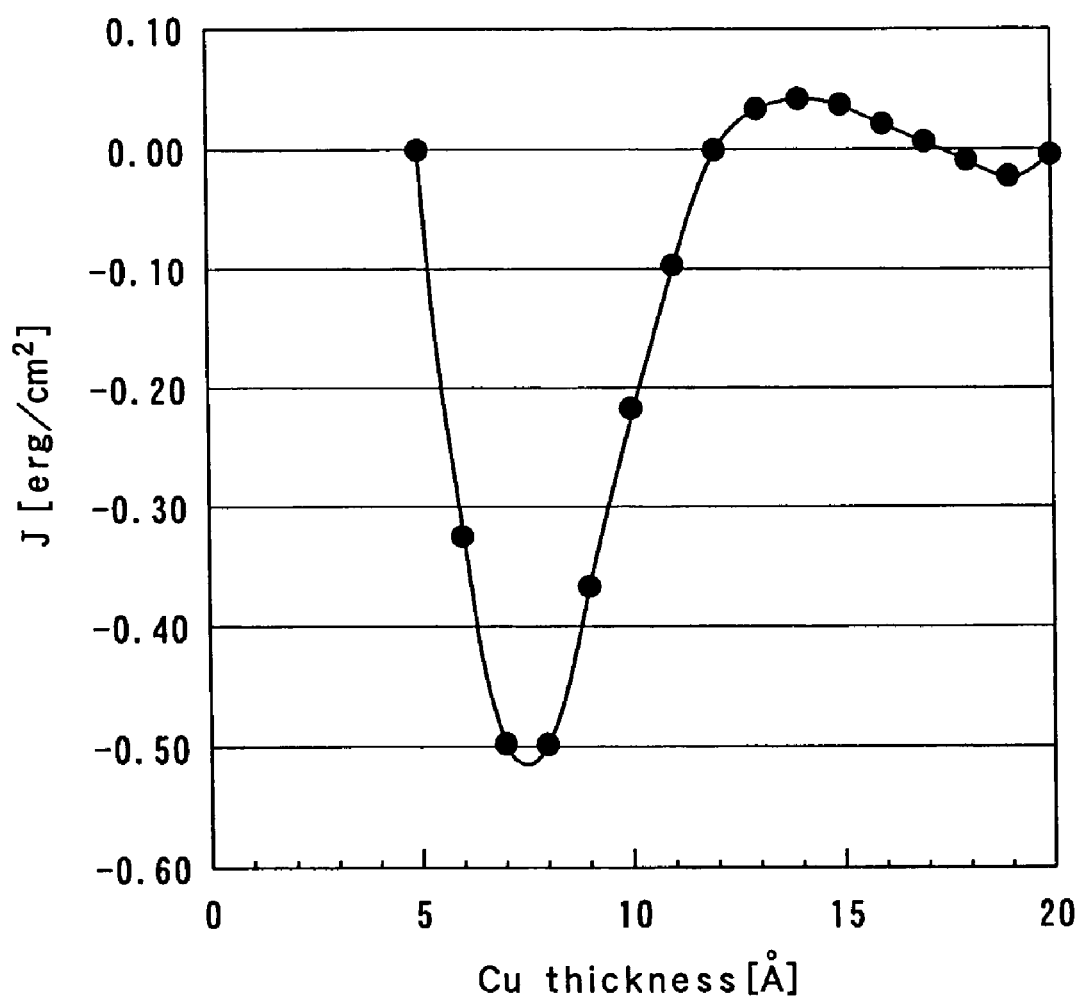
FIG. 9 is a graph indicative of the Cu thickness t (Å) vs. the exchange coupled magnetic filed strength J (erg/cm$^2$).

In the graphs of FIGS. 8 and 9, the value of the exchange coupled magnetic field strength J (erg/cm$^2$) is plus (+), there is the so-called ferromagnetically coupling taking place (where magnetic coupling occurs with magnetizations in the same direction). In contrast, when the value of the exchange coupled magnetic field strength J (erg/cm$^2$) is minus (−), there is the antiferromagnetically coupling taking place (where magnetic coupling occurs with magnetizations in the same direction).

The absolute value |J| of the exchange coupled magnetic filed strength J (erg/cm$^2$) is indicative of the absolute quantity of the coupled strength itself.

Preferably, the exchange coupling transfer layer 101, 105 should be designed such that the absolute value |J| of the exchange coupled magnetic field strength J (erg/cm$^2$) is greater than 0.2 (erg/cm$^2$): |J|>0.2 (erg/cm$^2$). As the absolute value |J| of the exchange coupled magnetic field strength J (erg/cm$^2$) is below 0.2 (erg/cm$^2$), it causes the magnetizations 111a and 115b of the gap adjustment layers 111 and 115 to fluctuate under the influences of a magnetic field from the medium, resulting in inconvenience that they may otherwise function as shields.

With these considerations in mind, it is herein desired that (1) when Cu is used for the exchange coupling transfer layer 101, 105, the thickness of Cu be set in the range of 6 to 10 Å, and (2) when Ru is used for the exchange coupling transfer layer 101, 105, the thickness of Ru be set in the ranges of 4 to 9 Å and 16 to 20 Å, as can be seen from the graphs of FIGS. 8 and 9.

In contrast, the exchange coupling transfer layer 121, 125 is preferably designed such that the absolute value |J| of the exchange coupled magnetic field strength J (erg/cm$^2$) is greater than 0.02 (erg/cm$^2$) but less than 0.6 (erg/cm$^2$): 0.02<|J|<0.6 (erg/cm$^2$). As the absolute value |J| of the exchange coupled magnetic field strength J (erg/cm$^2$) is below 0.02 (erg/cm$^2$), it causes the magnetization state of the first and second ferromagnetic layers 130 and 150 functioning as the free layers to come to have a multiple domain structure, resulting in inconvenience of giving rise to Barkhausen noises. As the absolute value |J| of the exchange coupled magnetic field strength J (erg/cm$^2$) is greater than 0.6 (erg/cm$^2$), it causes the magnetizations of the first and second ferromagnetic layers 130 and 150 functioning as the free layers to be incapable of freely responding to a signal magnetic field from the medium, resulting in inconvenience that may otherwise lead to sensitivity drops.

With these considerations in mind, it is herein desired that (1) when Cu is used for the exchange coupling adjustment layer 121, 125, the thickness of Cu be set in the range of 13 to 16 Å, and (2) when Ru is used for the exchange coupling adjustment layer 121, 125, the thickness of Ru be set in the range of 9.5 to 20 Å, as can be seen from the graphs of FIGS. 8 and 9.

It is noted that even when Rh, Ir, Cr, Ag, Au, Pt, and Pd is used as the materials to form the exchange coupling transfer layer 101, 105 and the exchange coupling adjustment layer 121, 125, the thickness of each may be set as is the case with Ru, and Cu.

Explanation of the Sensor Area Comprising the First Ferromagnetic Layer 130, the Nonmagnetic Intermediate Layer 140, and the Second Ferromagnetic Layer 150

As already referred to, the sensor area is defined by the multilayer structure comprising the first ferromagnetic layer 130, the nonmagnetic intermediate layer 140 and the second ferromagnetic layer 150, and the total thickness of that multilayer structure is about 10 to 20 nm. Of these layers, the first ferromagnetic layer 130 and the second ferromagnetic layer 150 function as the free layers, each having the direction of magnetization changing under the influences of an externally applied magnetic field.

For instance, the first 130, and the second ferromagnetic layer 150 is made of a material such as NiFe, CoFe, CoFeB, CoFeNi, $CO_2MnSI$, $CO_2MnGe$, and $FeO_x$ (an oxide of Fe), and has a thickness of about 0.5 to 8 nm.

The nonmagnetic intermediate layer 140 is the film essentially required to let the MR effect show up, and is typically made of Cu, Au, Ag, Zn, Ga, TiOx, ZnO, InO, SnO, GaN, ITO (indium tin oxide), $Al_2O_3$, and MgO. In a preferable embodiment, the nonmagnetic intermediate layer 140 is formed of a multilayer structure comprising two or more layers, for instance, a triple-layer structure film of Cu/ZnO/Cu. A triple-layer structure film of Cu/ZnO/Zn with Cu replaced by Zn is also preferable because of boosted-up output.

The nonmagnetic intermediate layer 140 has a thickness of about 0.5 to 5 nm.

(Explanation of Modifications to the Magneto-Resistive Effect Device)

FIGS. 3, 4 and 5 are illustrative, as in FIG. 2, of modifications to the construction of the magneto-resistive effect unit 8.

Commonly in any case, the first ferromagnetic layer 130 and the second ferromagnetic layer 150, each functioning as the free layer, receive such action that there is an antiparallel magnetization state created, where their magnetizations are in opposite directions, under the influences of magnetic actions from the first shield layer 3 and the second shield layer 5. What is different is whether antiferromagnetically coupling or ferromagnetically coupling is to be used depending on the material and thickness specifications of the exchange coupling transfer layer 101, 105 and the exchange coupling adjustment layer 121, 125.

Figure 6:
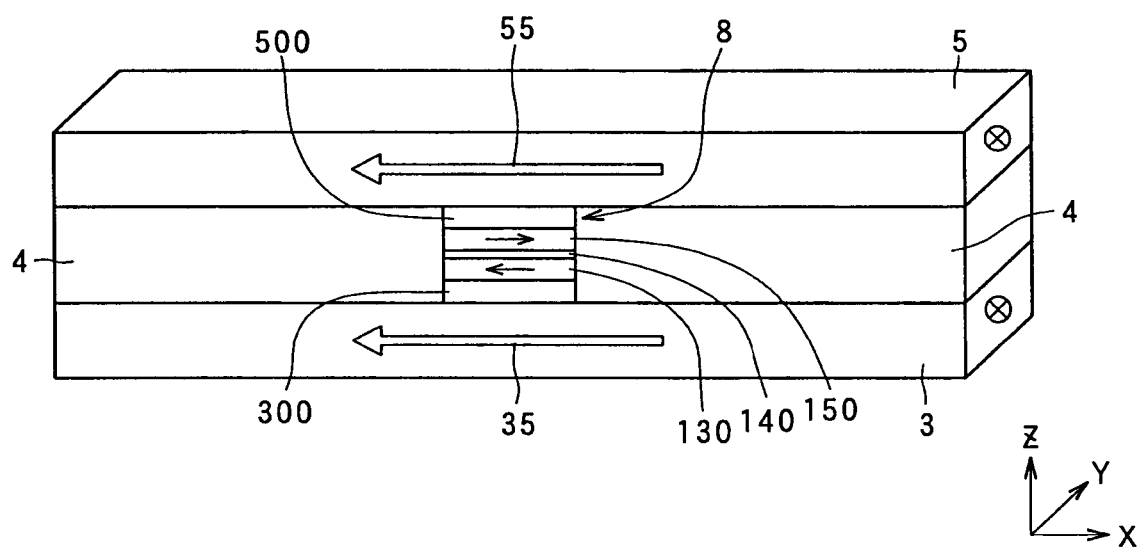
FIG. 6 is illustrative in perspective of the magneto-resistive effect device according to another embodiment of the invention, as viewed from the ABS (air bearing surface).
Figure 7:
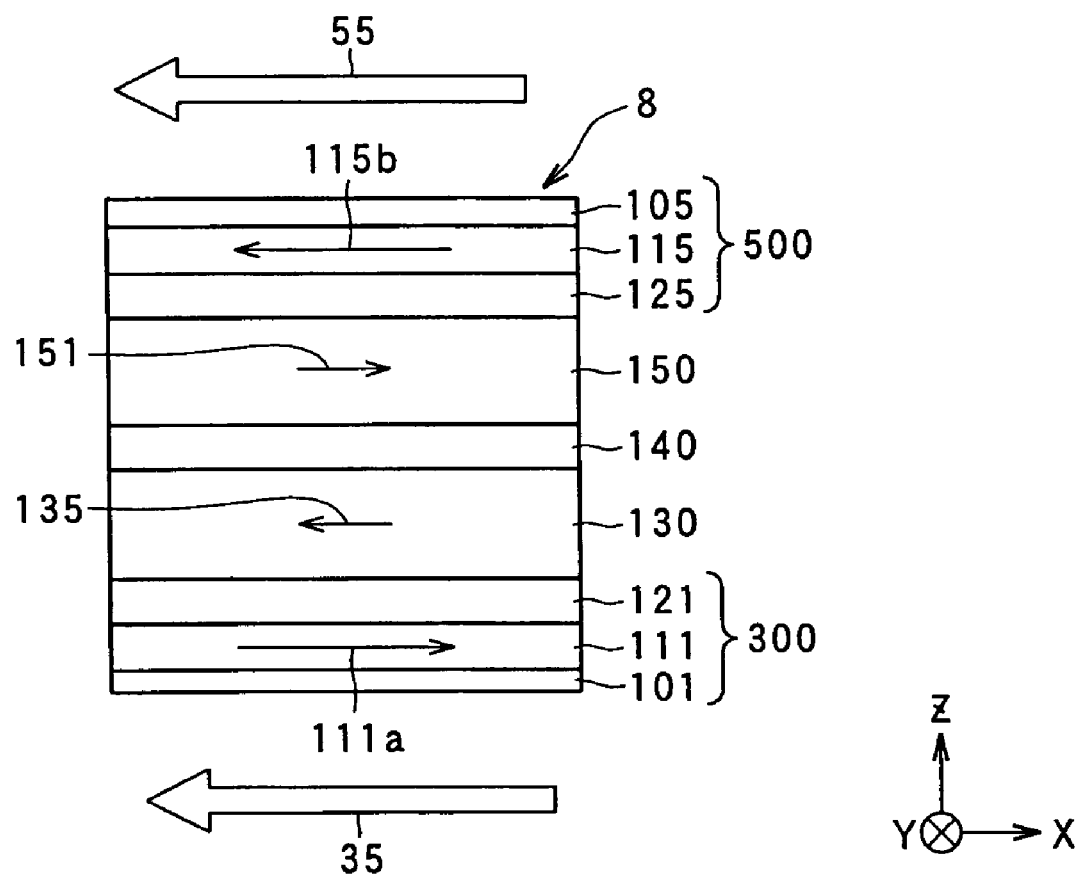
FIG. 7 is an enlarged schematic view of the magneto-resistive effect unit of the magneto-resistive effect device of FIG. 6 including a sensor area.

FIG. 6 is a perspective view of the magneto-resistive effect device according to another embodiment of the invention, as viewed from the ABS (air bearing surface). FIG. 7 is an enlarged schematic view of the magneto-resistive effect unit of the magneto-resistive effect device of FIG. 6 including the sensor area.

In the embodiment shown in FIG. 6, the first shield layer 3 has its magnetization fixed in the minus widthwise direction (−X direction) from the right to the left side of the paper. Likewise, the second shield layer 5 has its magnetization fixed in the minus widthwise direction (−X direction) from the right to the left side of the paper, too.

In this modified embodiment, too, the first 130 and the second ferromagnetic layer 150, each functioning as the free layer, receive such action that there is an antiparallel magnetization state created, where their magnetizations are in opposite directions, under the influences of magnetic actions from the first shield layer 3 and the second shield layer 5. The exchange coupling transfer layer 101, 105, and the exchange coupling adjustment layer 121, 125 can make use of either antiferromagnetically coupling or ferromagnetically coupling depending on what material is used and what thickness it is set at. Such modifications to the construction of the magneto-resistive effect unit 8 as shown in FIGS. 3, 4 and 5 may be applied to another embodiment of FIG. 7.

Figure 10:
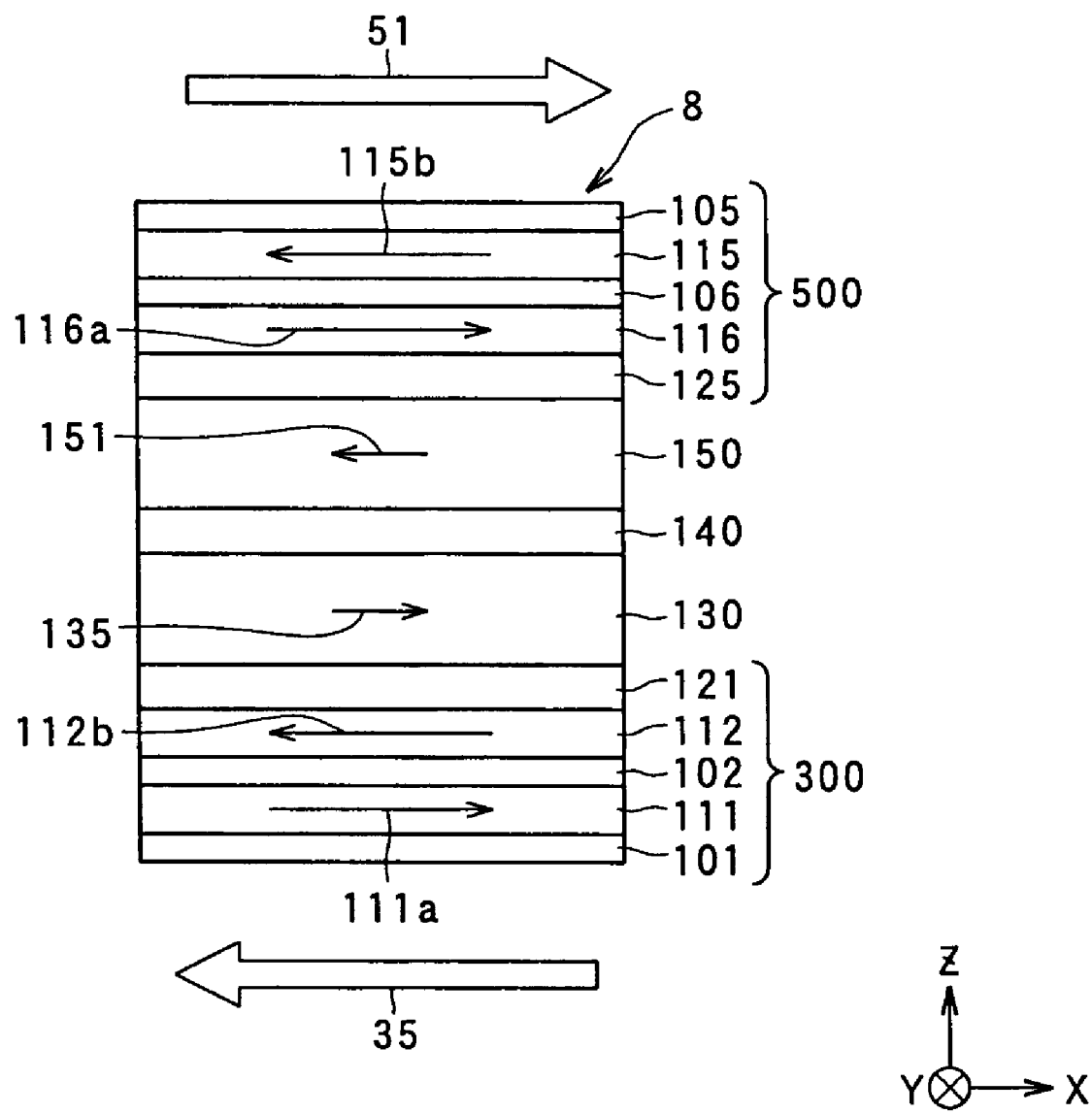
FIG. 10 is illustrative in section of a further modification to the construction of the magneto-resistive effect unit.

FIG. 10 is illustrative of another modification to the magneto-resistive effect unit 8. This modification is different from the aforesaid magneto-resistive effect unit 8 in terms of the construction of the first exchange coupling function gap layer 300, and the construction of the second exchange coupling function gap layer 500. That is, in FIG. 10, the first exchange coupling function gap layer 300 comprises, in order from the side of the first shield layer 3, an exchange coupling transfer layer 101, a gap adjustment layer 111, an exchange coupling transfer layer 102, a gap adjustment layer 112, and an exchange coupling adjustment layer 121. On the other hand, the second exchange coupling function gap layer 500 comprises, in order from the side of the second shield layer 5, an exchange coupling transfer layer 105, a gap adjustment layer 115, an exchange coupling transfer layer 106, a gap adjustment layer 116, and an exchange coupling adjustment layer 125. In this embodiment, too, the construction of each of the layers described as the exchange coupling transfer layer, gap adjustment layer and exchange coupling adjustment layer is the same as that of each of the exchange coupling transfer layer, gap adjustment layer and exchange coupling adjustment layer shown in FIGS. 1-7, etc. In the embodiment shown in FIG. 10, by (1) making strong antiferromagnetically coupling between two ferromagnetic layers, say, the gap adjustment layers 111 and 112 while both have the matching quantity of magnetization Mst, and (2) making strong antiferromagnetically coupling between two ferromagnetic layers, say, the gap adjustment layers 115 and 116 while both have the matching quantity of magnetization Mst, it is possible to reduce responses to the external magnetic field down to zero, thereby achieving more preferable advantages. Even when the coupling strength of the exchange coupling transfer layer is relatively weak, it is possible to make sure it has also a gap layer function. In the construction shown in FIG. 10, it is noted that the third peak of Ru may be used as the exchange coupling adjustment layer.

Figure 11:
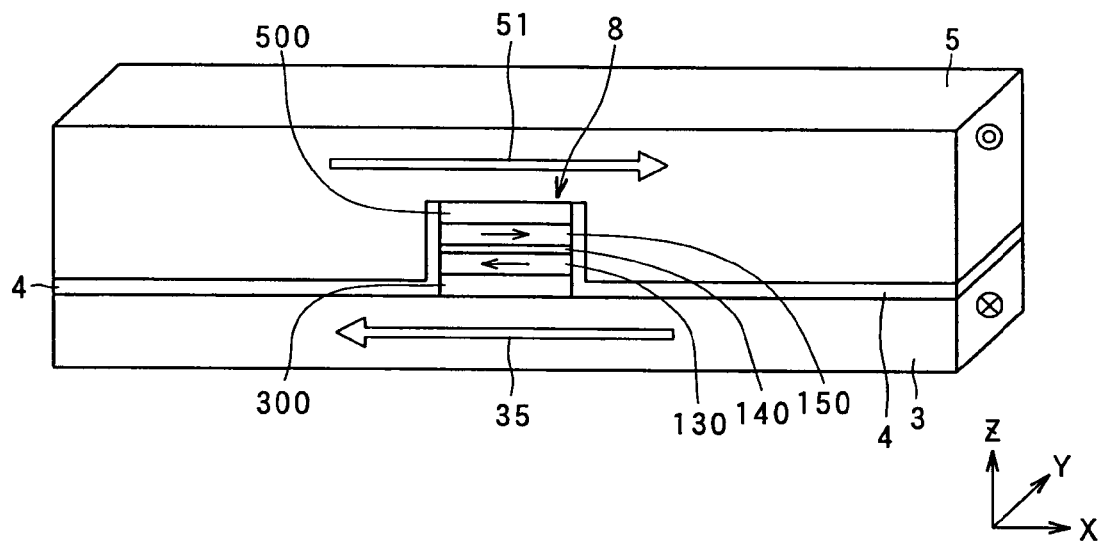
FIG. 11 is illustrative in perspective of the magneto-resistive effect device according to a further embodiment of the invention, as viewed from the ABS (air bearing surface).

FIG. 11 is a perspective view of the magneto-resistive effect according to yet another embodiment of the invention, as viewed from the ABS (air bearing surface). In the embodiment of FIG. 11, there is a recess provided in the middle of the upper or second shield layer 5, in which the magneto-resistive effect unit 8 is buried thereby achieving the so-called side shield structure wherein both sides of the magneto-resistive effect unit 8 are also magnetically shielded off. It is thus possible to make the width of a reproducing effective track narrow.

Figure 12:
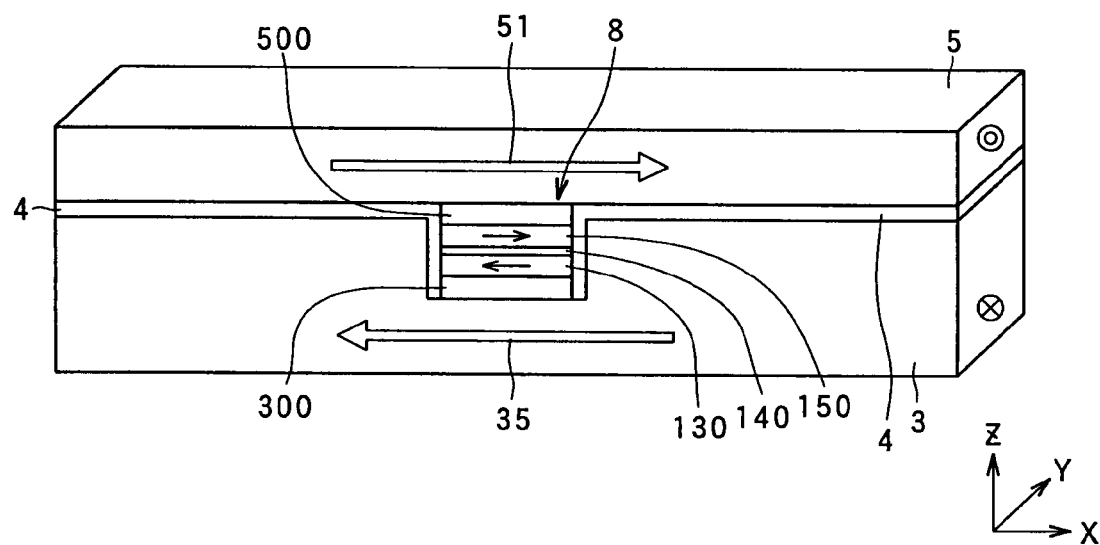
FIG. 12 is illustrative in perspective of the magneto-resistive effect device according to a further embodiment of the invention, as viewed from the ABS (air bearing surface).

FIG. 12 is a perspective view of the magneto-resistive effect according to a further embodiment of the invention, as viewed from the ABS (air bearing surface). In the embodiment of FIG. 12, there is a recess provided in the middle of the lower or first shield layer 3, in which the magneto-resistive effect unit 8 is buried thereby achieving the so-called side shield structure wherein both sides of the magneto-resistive effect unit 8 are also magnetically shielded off. It is thus possible to make the width of a reproducing effective track narrow.

Figure 13:
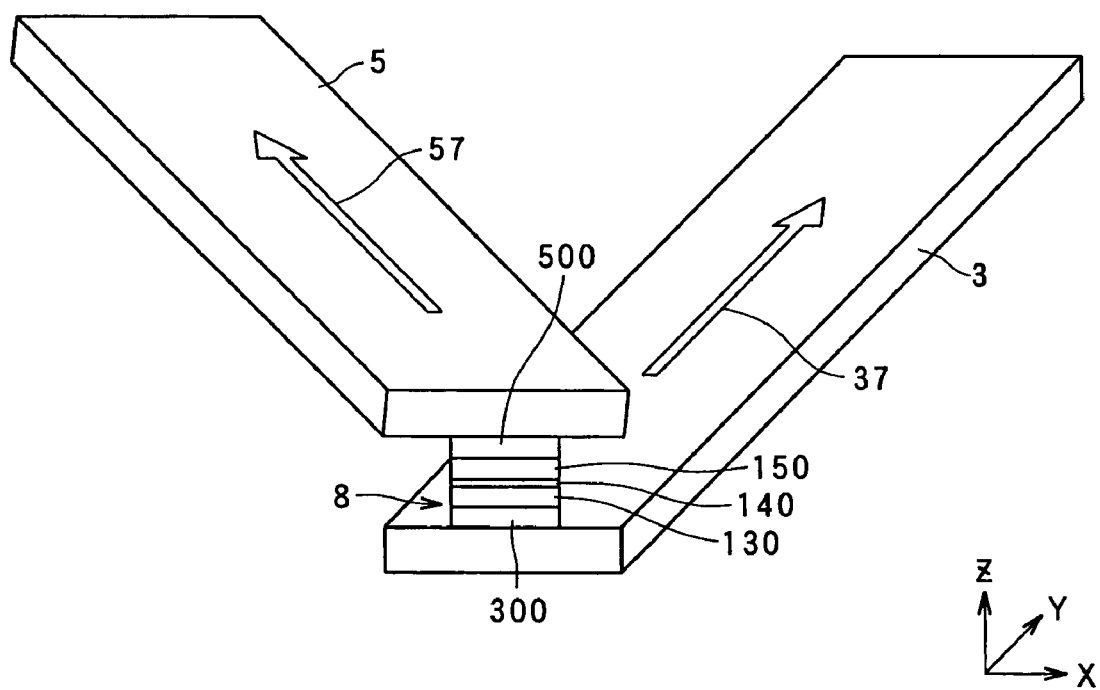
FIG. 13 is illustrative in perspective of the magneto-resistive effect device according to a further embodiment of the invention, as viewed from the ABS (air bearing surface).

FIG. 13 is a perspective view of the magneto-resistive effect device according to a further embodiment of the invention, as viewed from the ABS (air bearing surface). In the embodiment of FIG. 13, the first shield layer 3 and the second shield layer 5 are specifically configured and they are located in an orthogonal fashion so that their magnetizations lie in orthogonal directions, and the first ferromagnetic layer 130 and the second ferromagnetic layer 150 are magnetized in an orthogonal state. This can then dispense with any initial bias setting wherein, by applying a bias magnetic field to the initial antiparallel magnetization directions of the first 130 and the second ferromagnetic layer 150, they are magnetized in orthogonal directions. In short, any bias application means for orthogonal magnetizations is dispensed with.

[Explanation of the Operation of the Magneto-Resistive Effect Device of Detecting the External Magnetic Field]

Figure 14A:
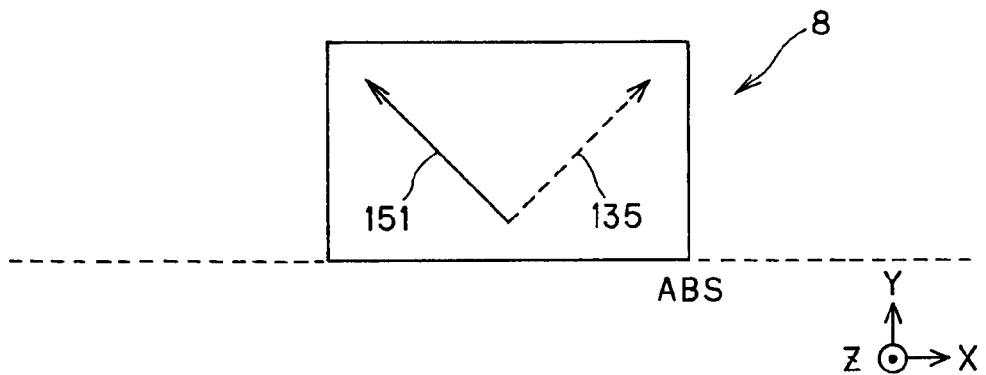
FIGS. 14A, 14B and 14C are models indicative of external magnetic field-depending changes in the state of magnetization where changes in the magneto-resistive effect of the inventive magneto-resistive effect device are obtainable.

The operation of the magneto-resistive effect device of the invention of detecting an external magnetic field is now explained with reference to FIGS. 14A, 14B and 14C.

Before the application of a bias magnetic field for placing magnetizations in orthogonal directions, the first 130 and the second ferromagnetic layer 150 are each in an antiparallel magnetization state where their magnetizations are in opposite directions under the influences of the magnetic actions of the first 3 and the second shield layer 5.

Usually, through bias magnetic field-applying means (not shown) such as a hard magnet located in the rear (the depth side: Y-direction) of the first 130 and the second ferromagnetic layer 150, a bias magnetic field is applied to the first 130 and the second ferromagnetic layer 150 so that the magnetizations 135 and 151 of the first 130 and the second ferromagnetic layer 150 are placed in orthogonal directions, creating such a state as shown in FIG. 14A. This state defines the initial state of the magneto-resistive effect device (the magneto-resistive effect unit 8).

Figure 14B:
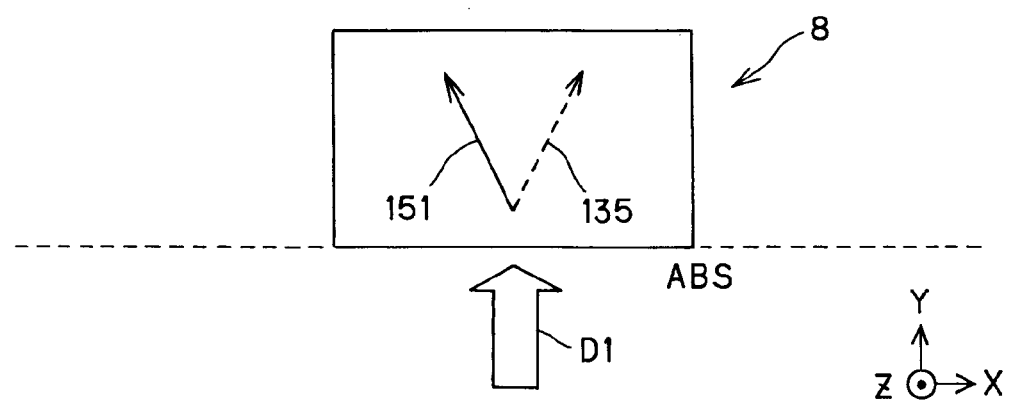

As an external magnetic field D1 flowing from the ABS into the device side is detected as shown in FIG. 14B, both the magnetizations 135 and 151 of the first 130 and the second ferromagnetic layer 150 tend to lie in the same direction so that the resistance of the device grows low.

Figure 14C:
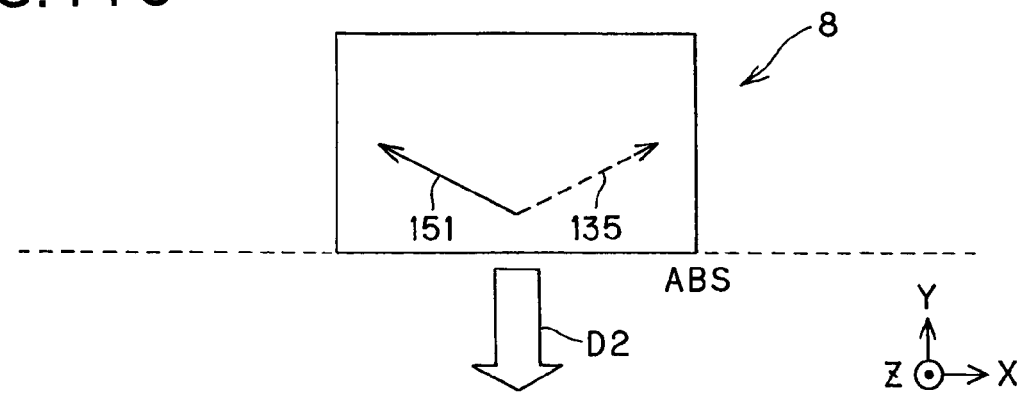

On the other hand, as an external magnetic field D2 in a direction away from the ABS is detected as shown in FIG. 14C, the magnetizations 135 and 151 of the first 130 and the second ferromagnetic layer 150 tend to lie in opposite directions so that the resistance of the device grows high.

By measuring such a series of resistance changes with the external magnetic field, it is possible to detect the external magnetic field.

[Explanation of the Whole Structure of the Thin-Film Magnetic Head]

One preferable construction of the whole structure of one preferable thin-film magnetic head according to the invention is now explained with reference to FIGS. 15A, 15B, 16 and 17.

Figures 15A, 15B:
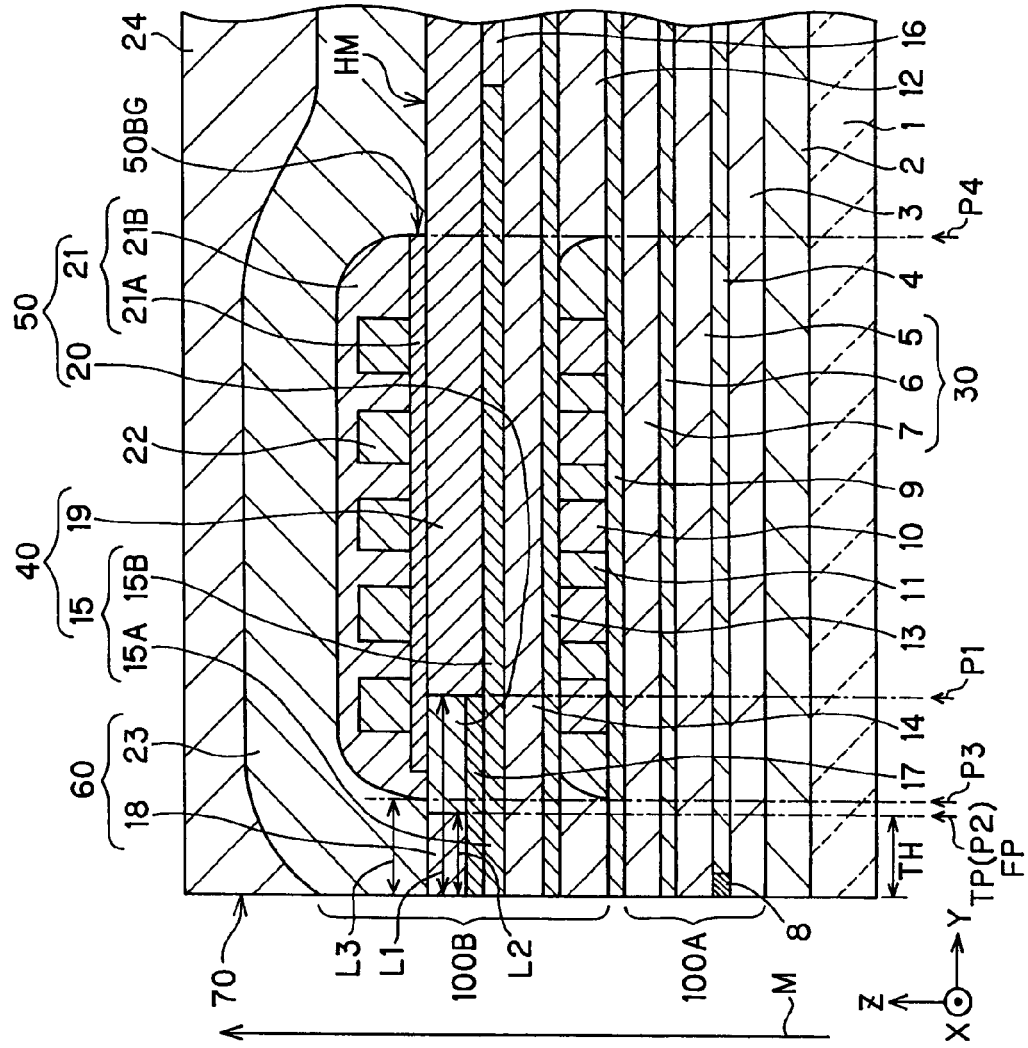
FIG. 15A is illustrative in section of the thin-film magnetic head parallel with the so-called air bearing surface (ABS)
FIG. 15B is illustrative in section of the thin-film magnetic head orthogonal to the air bearing surface.
Figure 16:
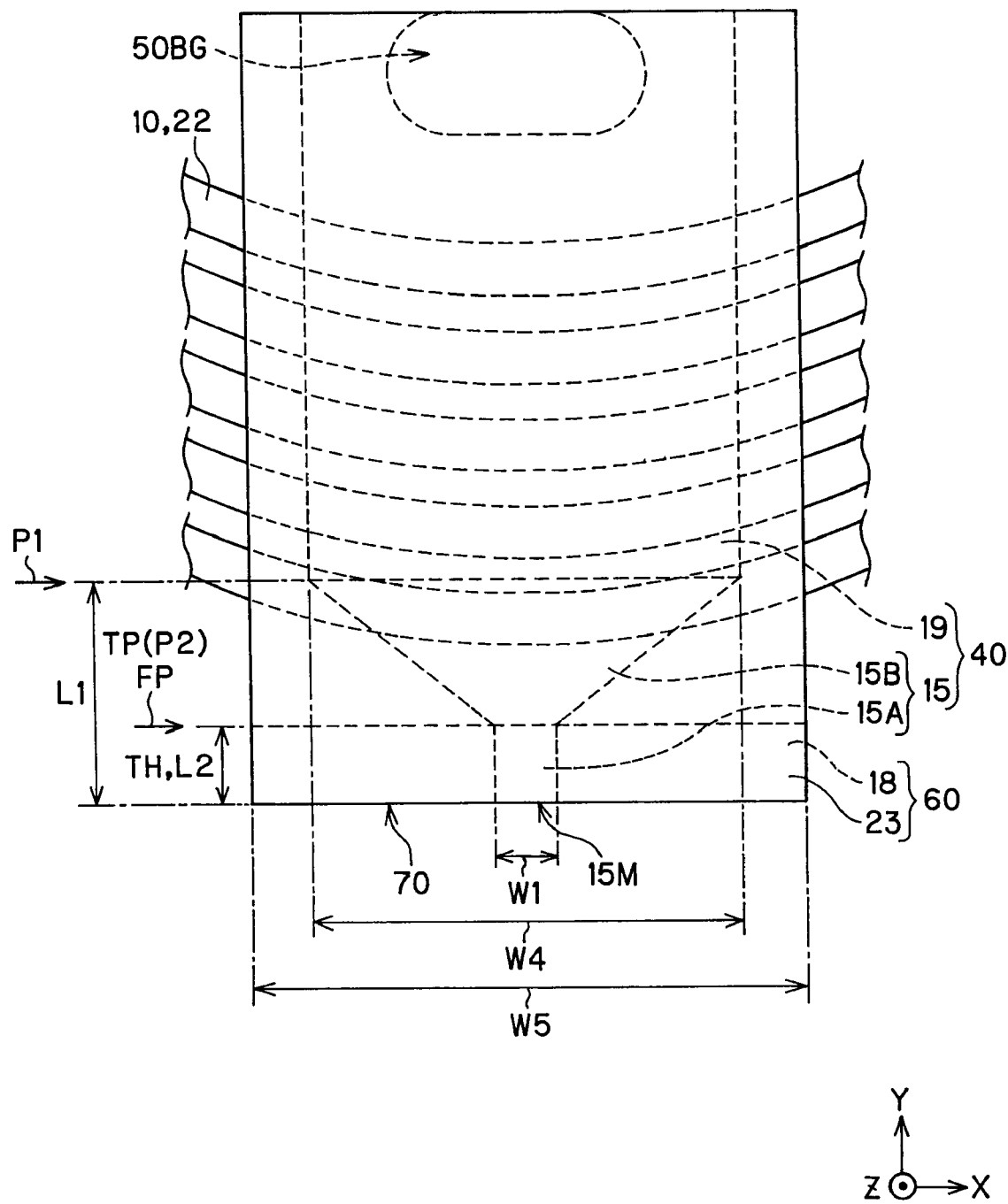
FIG. 16 is an enlarged perspective view of a portion of the write head near a magnetic pole.
Figure 17:
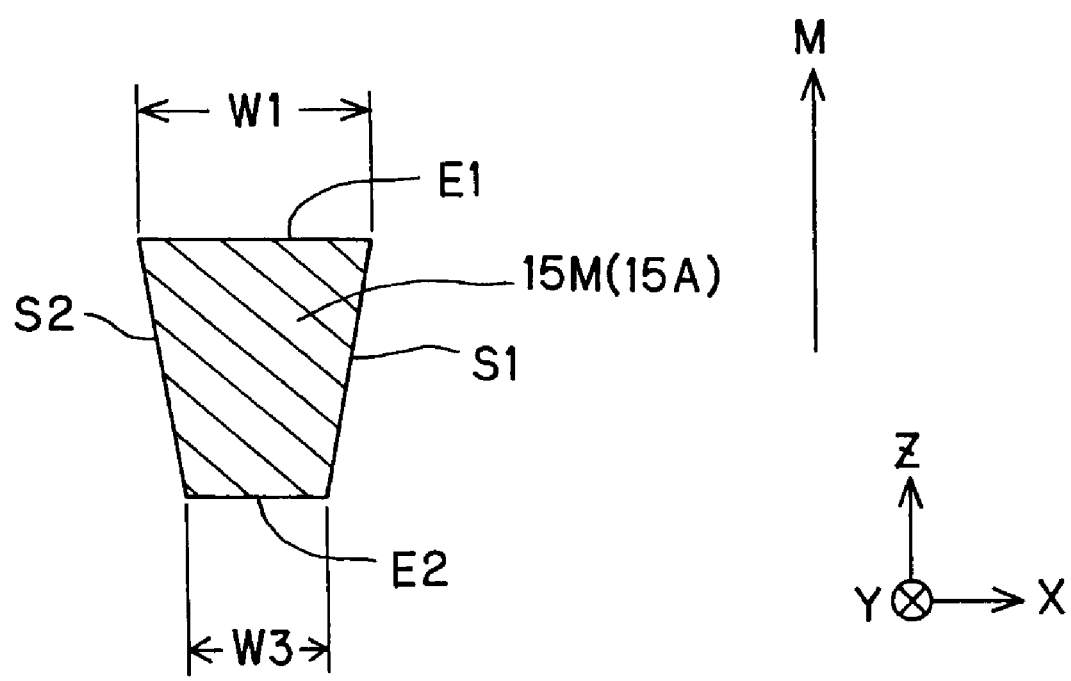
FIG. 17 is illustrative of the morphology of an end portion of the main magnetic pole at the air bearing surface.

FIG. 15A is illustrative in section of the thin-film magnetic head parallel with the so-called air bearing surface (ABS), and FIG. 15B is illustrative in section of the thin-film magnetic head orthogonal to the air bearing surface. The air bearing surface (ABS) here is equivalent to the plane (also called the medium opposite plane) at which the thin-film magnetic head is in opposition to a magnetic recording medium. FIG. 16 is an enlarged plan view of the thin-film magnetic head near a magnet pole layer adapted to implement perpendicular magnetic recording, and FIG. 17 is illustrative of the morphology of an end portion of a main magnetic pole at the air bearing surface.

The thin-film magnetic head shown in FIGS. 15A and 15B is used on a magnetic recording system such as a hard disk drive for the purpose of applying magnetic processing to a recording medium like a hard disk drive moving in the medium travel direction M.

For instance, the thin-film magnetic head illustrated in the drawings is a composite type head capable of implementing both recording and reproducing as magnetic processing. The structure comprises, as shown in FIG. 15, a substrate 1 made of a ceramic material such as AlTiC ($Al_2O_3.TiC$), and an insulating layer 2 made of a nonmagnetic insulating material such as aluminum oxide ($Al_2O_3$; hereinafter referred simply as alumina), a reproducing head portion 100A adapted to reproduce magnetic information recorded by harnessing the magneto-resistive (MR) effect, a separation layer 9 made of a nonmagnetic insulating material such as alumina, a shield type recording head portion 100B adapted to implement a perpendicular recording mode of recording processing, and an overcoat layer 24 made of a nonmagnetic insulating material such as alumina, all stacked one upon another on the substrate 1 in that order.

In the embodiment illustrated, the reproducing head portion 100A has a multilayer structure comprising a lower read shield layer 3, a magneto-resistive effect unit 8, and a shield layer 5 (in this embodiment, a part of an upper read shield layer 30) stacked one upon another in that order. Although not illustrated in the drawings, it is noted that the lower read shield layer 3 (the first shield layer 3) and the shield layer 5 (the second shield layer 5) must be set up in such a way as to let the aforesaid advantages of the invention show up. At the rear end face of the magneto-resistive effect unit 8 there is a shield gap film 4 formed.

In the embodiment shown in FIGS. 15A and 15B, both the lower 3 and the upper read shield layer 30 have a function of separating the magneto-resistive effect unit magnetically from the surroundings, extending rearward from the air bearing surface 70.

In the embodiment here, the upper read shield layer 30 is divided into two shield layers 5 and 7 in the thickness direction via the nonmagnetic layer 6. That is, the upper read shield layer 30 has a multilayer structure in which the upper first read shield layer 5, the nonmagnetic layer 6 and the upper second shield layer 7 are stacked together in that order.

The upper first read shield layer 5 is made of a magnetic material such as permalloy, and has a thickness of typically about 1.5 μm. The upper second read shield layer 7 is made of a magnetic material such as permalloy, too, and has a thickness of typically about 1.1 μm. The nonmagnetic layer 6 is made of a nonmagnetic material such as ruthenium (Ru) or alumina, and has a thickness of typically about 0.2 μm.

While it is shown and described that the upper read shield layer 30 has a multilayer structure, it is contemplated that it is not always required to have a multilayer structure; it could have a single-layer structure as is the case with the lower read shield layer 3.

The shield gap film 4, for instance, made of a nonmagnetic material such as alumina.

The recording head portion 100B, for instance, has a multilayer structure comprising a first-stage thin-film coil 10 buried around with insulating layers 11, 12, 13, a nonmagnetic layer 14, a main magnetic pole layer 40 partially buried around with an insulating layer 16, a gap layer 17, a second-stage thin-film coil 22 buried with an insulating layer 50 that forms a magnetic coupling opening (back gap 50BG) and a write shield layer 60, all stacked one upon another in order.

In FIG. 16, only a main part (thin-film coils 10, 22, main magnetic pole layer 40 and write shield layer 60) extracted out of the recording head portion 100B is primarily shown.

The thin-film coil 10 has a primary function of generating a leakage-preventive magnetic flux for holding back leakage of a recording magnetic flux produced at the thin-film coil 22. This thin-film coil 10 is made of a highly electroconductive material such as copper, and has a thickness of typically about 2.0 µm.

As typically shown in FIGS. 15 and 16, the thin-film coil 10 in particular has a spiral structure having turns about the back gap 50BG. The thin-film coil 10 typically operates such that currents flow in a direction opposite to the direction taken by currents flowing through the thin-film coil 22. While it is shown in FIGS. 15 and 16 that the thin-film coil 10 has five turns by way of illustration alone, it is contemplated that the number of turns could optionally be varied. Preferably, the thin-film coil 10 should have as many turns as the thin-film coil 22, for instance, 2 to 7 turns. The thin-film coil 10 may also be configured as a helical coil.

The insulating layers 11, 12, 13 are formed in such a way as to separate the thin-film coil 10 electrically from the surroundings. The insulating layer 11 is formed in such a way as to be filled up between the turns of the thin-film coil 10 and provide a cover around the thin-film coil 10. This insulating layer 11 is made of a non-magnetic insulating material such as a photoresist (photosensitive material) exhibiting fluidity upon heating, and has a thickness of typically about 2.0 µm.

In the embodiment here, the insulating layer 11 is formed in such a way as to cover only the sides of the thin-film coil 10 but provide no cover to the upper side of the thin-film coil 10, as shown in FIG. 15.

The insulating layer 12 is formed in such a way as to provide a cover around the insulating layer 11. This insulating layer 12 is made of a nonmagnetic material such as alumina, and has a thickness of typically about 2.0 µm.

The insulating layer 13 is formed in such a way as to give a cover to the thin-film coil 10 as well as the insulating layers 11, 12. This insulating layer 13 is made of a nonmagnetic material such as alumina, and has a thickness of typically about 0.2 µm.

The nonmagnetic layer 14 is formed of a nonmagnetic insulating material such as alumina, or a nonmagnetic electroconductive material such as ruthenium, and has a thickness of typically about 1.0 µm.

The main magnetic pole layer 40 has a primary function of implementing recording processing by receiving a magnetic recording magnetic flux produced at the thin-film coil 22 and releasing that magnetic flux toward the recording medium for implementing recording processing. More specifically, the main magnetic pole layer 40 is to generate a magnetic field (perpendicular magnetic field) to magnetize the recording medium in the direction orthogonal to its surface on the basis of a recording magnetic flux, thereby implementing recording processing in the perpendicular recording mode.

Such main magnetic pole layer 40 is located on the leading side of the thin-film coil, extending rearward from the air bearing surface 70, more specifically, as far as the back gap 50BG. It is noted that when the state of movement of the recording medium that moves toward the medium travel direction M shown in FIG. 15 is viewed as a sort of flow, the aforesaid "leading side" would refer to the incoming side (opposite to the medium travel direction M side) of that flow that is here corresponding to the upstream side in the thickness (Z-axis) direction. By contrast, the outgoing side of the flow (the medium travel direction M side) would be called the "trailing side" that is here corresponding to the downstream side in the thickness direction.

In the embodiment here, the main magnetic pole layer 40 has a structure where, as shown in FIG. 15, a main magnetic pole 15 and a magnetic pole main layer 19 are stacked one upon another in order and thereby coupled to each other. In other words, it has a multilayer (double-layer) structure where the main magnetic pole 15 is located on the leading side and the magnetic pole main layer 19 is located on the trailing side.

The main magnetic pole 15 functions as a portion for releasing off a main writing magnetic flux. This main magnetic pole 15 extends rearward from the air bearing surface 70 on the leading side, more specifically, as far as the back gap 50BG, and has a thickness of typically about 0.25 µm. Such main magnetic pole 15, for instance, is made of a magnetic material having a saturation flux density higher than that of the magnetic material forming the magnetic pole main layer 19, for instance, an iron alloy or the like. The iron alloy here, for instance, includes an iron-nickel alloy (FeNi), an iron-cobalt alloy (FeCo) or an iron-cobalt-nickel alloy (FeCoNi), all rich in iron (Fe).

It is noted that the aforesaid "coupled" would mean just only a coupling involving physical contact but also a coupling involving physical contact plus a magnetically conductive coupling.

As shown in FIG. 16, for instance, the main magnetic pole 15 is configured in a generally battledore type planar shape. To be more specific, the main magnetic pole 15 comprises, in order from the air bearing surface 70, a front end 15A that extends rearward from that air bearing surface 70 and having a constant width W1 for defining the recording track width of the recording medium and a rear end 15B that is linked to the rear of that front end 15A and having a width W4 greater than the width W1 (W4>W1). The position at which the width of the main magnetic pole 15 starts growing wide from the front end 15A (of width W1) toward the rear end 15B (of width W4) is a "flare point FP" that is one of important determinants for the recording performance of the thin-film head. Note here that the main magnetic pole 15 may contact the magnetic pole main layer 19 from its bottom (substrate side) alone, thereby linking magnetically to it.

The front end 15A is primarily adapted to substantially release a recording magnetic flux produced at the thin-film coil 22 toward the recording medium, and has an exposed surface 15M exposed on the air bearing surface 70, as shown in FIG. 16.

As shown typically in FIG. 17, the exposed surface 15M takes a planar shape defined by an upper end edge (one end edge) E1 positioned on the trailing side, a lower end edge (another end edge) E2 positioned on the leading side, and two side end edges S1 and S2. To be more specific, the exposed surface 15M typically assumes on a trapezoidal shape with its width becoming gradually narrow from the trailing side toward the leading side (W1>W3). The trailing edge T1 of the front end 15A provides a substantial recording site of the magnetic pole layer 40.

The rear end 15B shown in FIG. 16 is adapted to receive the magnetic flux contained in the magnetic pole main layer 19 and feed it to the front end 15A. Typically, the width of this rear end 15B remains constant (width W4) in the rear, and becomes gradually narrow from width W4 to width W1 in the front as the front end 15A comes near.

The magnetic pole main layer 19 functions as a portion adapted to receive a dominant magnetic flux. Typically, this magnetic pole main layer 19 extends rearward from a position P1 (the first position) receded from the air bearing surface 70. To be more specific, it extends as far as the rear of the main magnetic pole 15 at the back gap 50BG, and has a thickness of typically about 0.45 μm. In particular, the magnetic pole main layer 19 is made of a magnetic material having a saturation magnetic flux density lower than that of the magnetic material forming the main magnetic pole 15, preferably, an iron-cobalt-nickel alloy.

As shown typically in FIG. 16, the magnetic pole main layer 19 has a rectangular planar shape of width W4. In the magnetic pole main layer 19 in particular, both an auxiliary insulating layer 20 of the insulating layer 50 to be described later and a TH defining layer 18 of the write shield layer 60 to be described later are flattened. That is, the end face of the magnetic pole main layer 19 on the trailing side forms a flat plane HM together with the end face of the auxiliary insulating layer 20 on the trailing side and the end face of the TH defining layer 18 on the trailing side.

The insulating layer 16 is provided to isolate the main magnetic pole 15 electrically from the surroundings. This insulating layer 16 is made of a nonmagnetic insulating material such as alumina, and has a thickness of typically about 0.25 μm.

The gap layer 17 is formed in such a way as to provide a gap for the magnetic separation of the magnetic layer 40 from the write shield layer 60. As typically shown in FIG. 15, the gap layer 17 extends rearward from the air bearing surface 70 along the main magnetic pole 15 except an area with the magnetic pole main layer 19 located on it. In particular, the gap layer 17 is made of a nonmagnetic insulating material such as alumina or a nonmagnetic electroconductive material such as ruthenium, and has a thickness of typically about 0.03 to 0.1 μm.

The insulating layer 50 defines the throat height TH that is one of important determinants for the recording performance of the thin-film magnetic head, and is adapted to cover the thin-film coil 22 in such a way as to isolate it electrically from the surroundings. As shown in FIG. 15, the insulating layer 50 has a structure wherein an auxiliary insulating layer 20 (the first insulating layer portion) formed in such a way as to substantially define the throat height TH and a main insulating layer 21 (the second insulating layer portion) formed in such a way as to substantially cover the thin-film coil 22 are stacked one upon another in that order. It follows that there is a multilayer (double-layer) structure involved, wherein the auxiliary insulating layer 20 is located on the leading side and the main insulating layer 21 is located on the trailing side.

As shown in FIG. 15, the auxiliary insulating layer 20 extends along the gap layer 17 and from a position receded from the air bearing surface 70, viz., a position P2 (the second position) between the air bearing surface 70 and a position P1 to the position P1 in the rear. And, the auxiliary insulating layer 20 is provided in such a way as to be adjacent to the magnetic pole main layer 19 at the position P1, and adjacent to the write shield layer 60 (the TH defining layer 18 to be described later) at the position P2. In the embodiment here in particular, the auxiliary insulating layer 20 defines a flat plane HM together with the magnetic pole main layer 19 and TH defining layer 18.

The aforesaid "position P2" is corresponding to the foremost end position of the insulating layer 50 (nearest to the air bearing surface 70). That is, there is a "zero throat height position TP" for defining the throat height TH. That throat height TH is a distance between the air bearing surface 70 and the zero throat height position TP. This auxiliary insulating layer 20 is made of a nonmagnetic insulating material such as alumina. In the embodiment shown in FIGS. 15 and 16, the zero throat height position TP is in coincidence with the flare point FP.

As shown in FIG. 15, the main insulating layer 21 extends rearward from a position P3 (the third position) between the positions P1 and P2 while lying along the flat plane HM of the auxiliary insulating layer 20. More specifically, the main insulating layer 21 extends in such a way as not to fill up the back gap 50BG, and is receded from the auxiliary insulating layer 20. As shown typically in FIG. 15, this main insulating layer 21 comprises a main insulating layer portion 21A that is located as an underlay of the thin-film coil 22 on the flat plane HM of the auxiliary insulating layer 20, and a main insulating layer portion 21B that is located in such a way as to cover the thin-film coil 22 and the main insulating layer portion 21A around it.

The main insulating layer portion 21A is made of a nonmagnetic material such as alumina, and has a thickness of typically about 0.2 μm.

The main insulating layer portion 21B is made of a nonmagnetic insulating material such as a photoresist or spin-on-glass (SOG) that exhibits fluidity upon heating. A portion of this main insulating layer portion 21B at and near its end edge is in such a rounded slant shape as to fall away toward that end edge.

The thin-film coil 22 is formed for the generation of a recording magnetic flux. For instance, the thin-film coil 22 operates such that currents flow in the direction opposite to the direction taken by currents through the aforesaid thin-film coil 10.

The write shield layer 60 works capturing the spreading component of a recording magnetic flux released off the magnetic pole layer 40, thereby holding back the spreading of that magnetic flux. Located on the trailing side of the main magnetic pole layer 40 and thin-film coil 22, the write shield layer 60 extends rearward from the air bearing surface 70, whereby it is spaced by the gap film 17 away from the magnetic pole layer 20 on its side near to the air bearing surface 70, and linked to the magnetic layer 40 through the back gap 50BG in its side far away from the air bearing surface 70.

The write shield layer 60 here comprises the TH defining layer 18 (the first magnetic shield layer portion) and a yoke layer 23 (the second magnetic shield layer portion) that are separate from each other, and has a structure wherein the TH defining layer 18 and yoke layer 23 are coupled to each other. It is here noted that the write shield layer 60 is not limited to the coupled structure as shown; it may be an integral structure.

The TH defining layer 18 functions as a dominant magnetic flux inlet port adapted to capture an extra portion of the magnetic flux released directly from the magnetic pole. As shown typically in FIG. 15, this TH defining layer 18 extends from the air bearing surface 70 as far as a position in the rear, more specifically, as far as the position P2 in front of the position P1 while lying adjacent to the gap layer 17, so that at that position P2 it lies adjacent to the auxiliary insulating layer 20 of the insulating layer 50.

The TH defining layer 18 is made of a magnetic material having a high saturation flux density such as permalloy or iron alloys, and assumes on a rectangular planar shape having a width W5 larger than the width W4 of the main magnetic pole layer 40 (W5>W4), as shown in FIG. 16. In particular, the TH defining layer 18 forms the flat plane HM together with the magnetic pole main layer 19 and auxiliary insulating layer 20, as typically described above. In other words, the end face of the TH defining layer 18 on the trailing side forms the flat plane HM together with both the end face of the magnetic pole main layer 19 on the trailing side and the end face of the auxiliary insulating layer 20 on the trailing side. The TH defining layer 18 lies adjacent to the auxiliary insulating layer 20 at the position P2 as described above; that is, the TH defining layer 18 takes a substantial role of defining the foremost end position of the insulating layer 50 (the zero throat height position TH), thereby defining the throat height TH.

The yoke layer 23 is set up in such a way as to function as a passage for the magnetic flux captured out of the TH defining layer 18, and function as a return yoke for allowing the magnetic flux to go back from the lining layer of the medium. As shown typically in FIG. 15, the yoke layer 23 goes over the TH defining layer 18, extending at least as far as the back gap 50BG from the air bearing surface 70 via on the insulating layer 50. In other words, in the front, there is the yoke layer 23 going over the TH defining layer 18 and linked to it, and in the rear, there is the yoke layer 23 lying adjacent to the main magnetic pole layer 40 through the back gap 50BG and linked to it.

In the embodiment here, for instance, the yoke layer 23 extends as far as the rear of the back gap 50BG while linked to the main magnetic pole layer 40 at the back gap 50BG. Such yoke layer 23, for instance, is made of a magnetic material similar to that of which the TH defining layer 18 is made, and takes a rectangular planar shape having a width W5 as shown in FIG. 16.

For such a thin-film magnetic head as described above, it is desired that constant dimensions defined on the basis of a specific component element be optimized to make sure recording performance, as typically shown in FIG. 15. More specifically, the distance of the auxiliary magnetic pole 19 receded from the air bearing surface 70, viz., the distance L1 between the air bearing surface 70 and the position P1 should preferably be 0.8 to 7.1 µm. The distance of the main insulating layer 21 receded from the air bearing surface 70, viz., the distance L3 between the air bearing surface 70 and the position P3 should be greater than the length of the TH defining layer 18, viz., the distance L2 between the air bearing surface 70 and the position P2 (L3>L2). In consideration of the structural relation where the distance L3 is greater than the distance L2, the write shield layer 60 is designed such that the length of a portion of the yoke layer 23 adjacent to the TH defining layer 18 (viz., the distance L3) is greater than the length of the TH defining layer (viz., the distance L2). In other words, when the magnetic flux is captured in the yoke layer 23 of the write shield layer 60 via the TH defining layer 18, the magnetic path taken by that magnetic flux flowing through the write shield layer 60 is incrementally expanded.

It is here noted that the whole structure of the thin-film magnetic head as described above is never limited to that described above, and so may be modified in various ways.

Such a thin-film magnetic head may mainly be fabricated by forming and stacking together component elements using existing thin-film processes inclusive of film-formation techniques as represented by plating or sputtering, patterning techniques as represented by photo-lithography, and etching techniques as represented by drying etching or wet etching.

[Explanation of the Head Gimbal Assembly and the Hard Disk System]

One example of the head gimbal assembly, and the hard disk system, with the foregoing thin-film head mounted on it, is now explained.

A slider 210 included in the head gimbal assembly is first explained with reference to FIG. 18. In the hard disk system, the slider 210 is located in such a way as to face a hard disk that is a rotationally driven disk-form recording medium. This slider 210 primarily comprises a substrate 211 built up of a substrate and an overcoat.

The substrate 211 is in a generally hexahedral shape. Of the six surfaces of the substrate 211, one surface is in opposition to the hard disk. On that one surface there is the medium opposite plane 30 formed.

Figure 18:
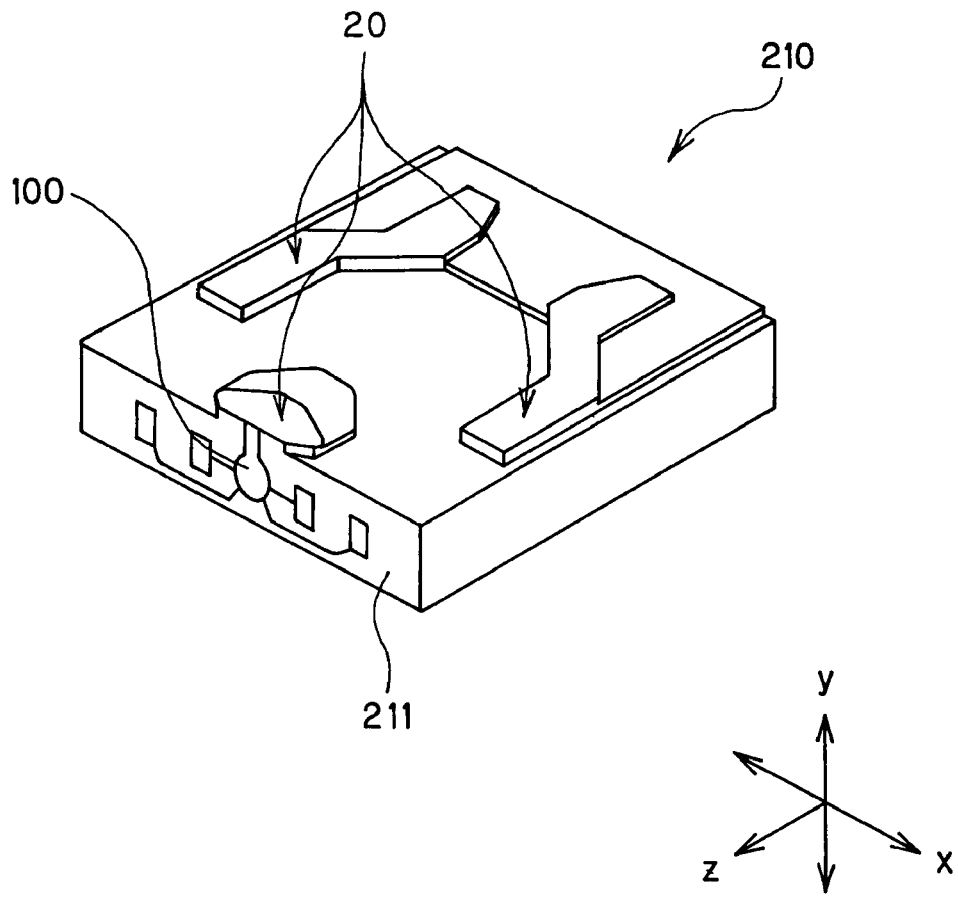
FIG. 18 is illustrative in perspective of the slider included in the head gimbal assembly according to one embodiment of the invention.

As the hard disk rotates in the z-direction in FIG. 18, it causes an air flow passing between the hard disk and the slider 210 to induce lift relative to the slider 210 in the downward y-direction in FIG. 18. This lift in turn causes the slider 210 to levitate over the surface of the hard disk. Note here that the x-direction in FIG. 18 traverses tracks on the hard disk.

Near the end of the slider 210 on an air exit side (the left lower end in FIG. 18), there is the thin-film magnetic head formed according to the embodiment here.

A head gimbal assembly 220 according to this embodiment is now explained with reference to FIG. 19. The head gimbal assembly 220 comprises a slider 210 and a suspension 221 adapted to resiliently support that slider 210. The suspension 221 comprises a leaf spring-form load beam 222 made of typically stainless steel, a flexure 223 attached to one end of the load beam 222 and having the slider 210 joined to it for giving a suitable degree of flexibility to the slider 210, and a base plate 224 attached to the other end of the load beam 222.

The base plate 224 is adapted to be attached to an arm 230 of an actuator for moving the slider 210 in the track traverse direction x of the hard disk 262. The actuator comprises the arm 230 and a voice coil motor for driving that arm 230. At a portion of the flexure 223 having the slider 210 attached to it, there is a gimbal portion provided for keeping the posture of the slider 210 constant.

The head gimbal assembly 220 is attached to the arm 230 of the actuator. The head gimbal assembly 220 attached to one arm 230 is called a head arm assembly, whereas the head gimbal assembly 220 attached to a carriage at its plurality of arms is referred to as a head stack assembly.

Figure 19:
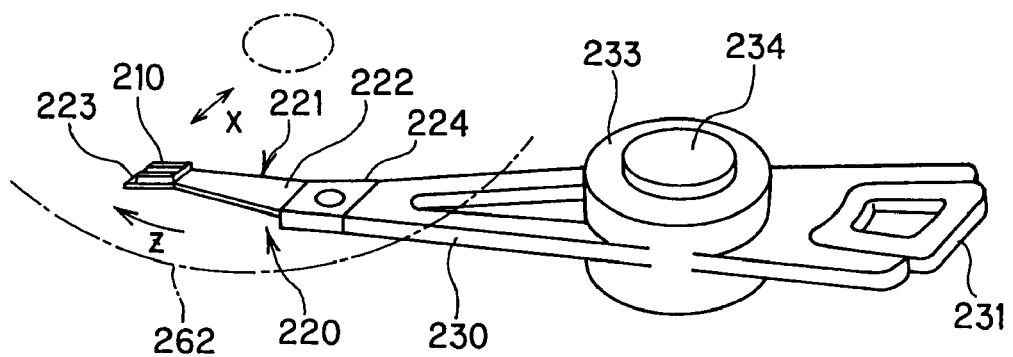
FIG. 19 is illustrative in perspective of the head arm assembly comprising the head gimbal assembly according to one embodiment of the invention.

FIG. 19 illustrates one example of the head arm assembly, wherein the head gimbal assembly 220 is attached to one end of the arm 230. To the other end of the arm 230, a coil 231 forming a part of the voice coil motor is attached. Halfway across the arm 230, there is a bearing portion 233 attached to a shaft 234 adapted to support the arm 230 in a pivotal fashion.

One each example of the head stack assembly and the hard disk system according to the embodiment here are now explained with reference to FIGS. 20 and 21.

Figure 20:
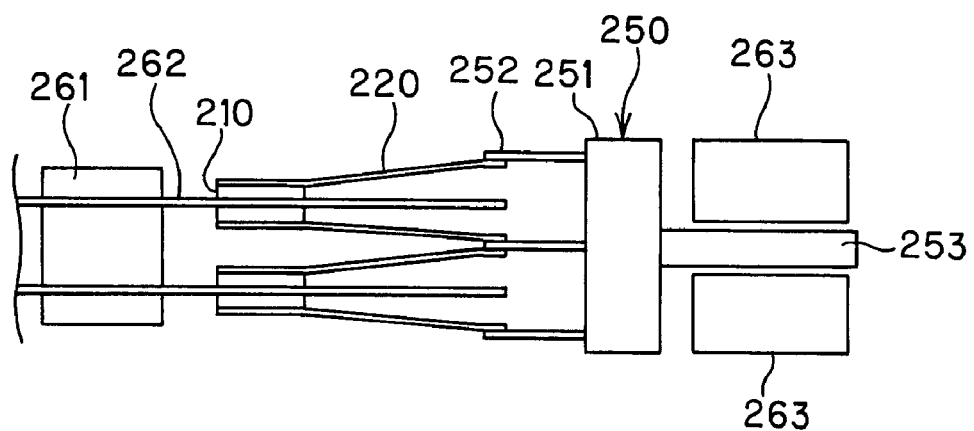
FIG. 20 is illustrative of part of the hard disk system according to one embodiment of the invention.
Figure 21:
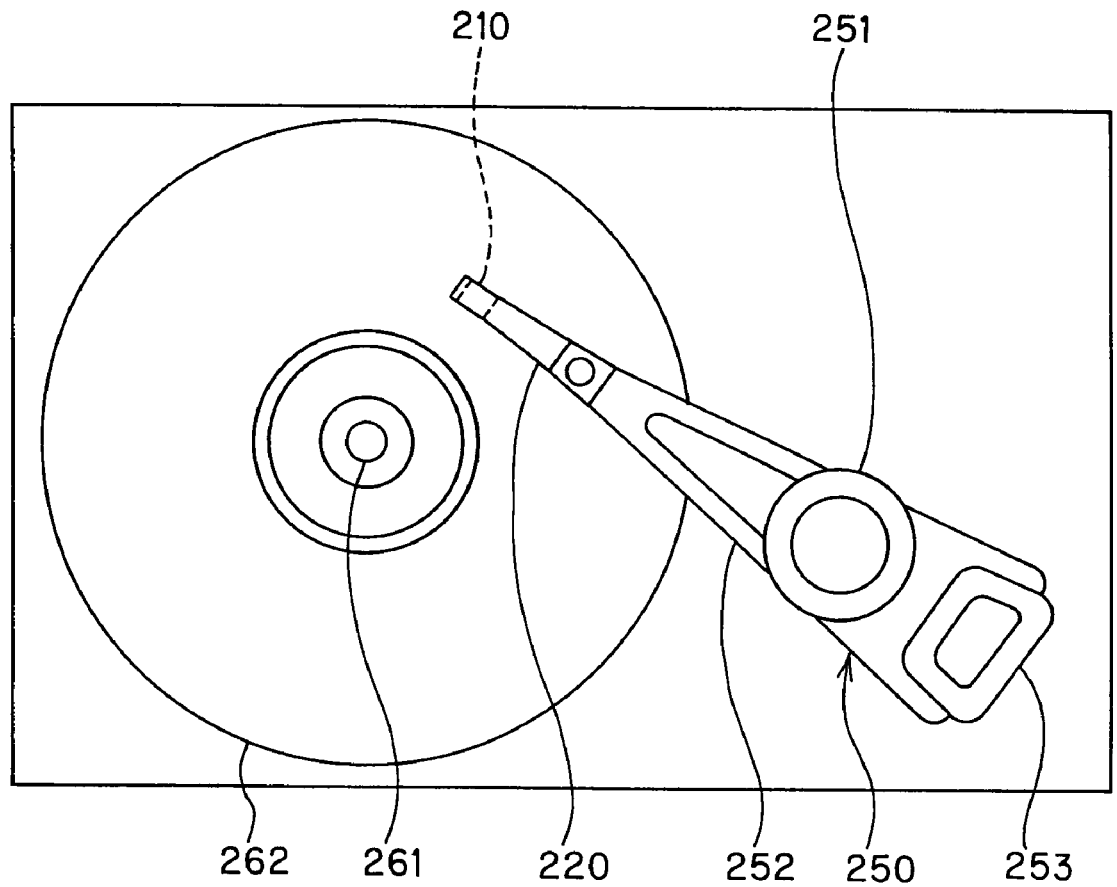
FIG. 21 is a plan view of the hard disk system according to one embodiment of the invention.

FIG. 20 is illustrative of part of the hard disk system, and FIG. 21 is a plan view of the hard disk system.

A head stack assembly 250 comprises a carriage 251 having a plurality of arms 252. The plurality of arms 252 are provided with a plurality of the head gimbal assemblies 220 such that they line up perpendicularly at an interval. On the side of the carriage 251 that faces away from the arms 252, there is a coil 253 attached, which coil becomes a part of the voice coil motor. The head stack assembly 250 is incorporated in the hard disk system.

The hard disk system comprises a plurality of hard disks 262 attached to a spindle motor 261. For each hard disk 262, two sliders 210 are located such that they are opposite to each other with the hard disk 262 held between them. The voice coil motor has also permanent magnets 263 located at opposite positions with the coil 253 of the head stack assembly 250 held between them.

The head stack assembly 250 except the slider 210 and the actuator correspond to the positioning device here which is operable to support the slider 210 and position it relative to the hard disk 262.

With the hard disk system here, the actuator is actuated to move the slider 210 in the track traverse direction of the hard disk 262, thereby positioning the slider 210 with respect to the hard disk 262. The thin-film magnetic head incorporated in the slider 210 works such that information is recorded by a recording head in the hard disk 262, and the information recorded in the hard disk 262 is played back by a reproducing head.

The head gimbal assembly and the magnetic disk system here have pretty much the same action as the thin-film magnetic head according to the foregoing embodiment.

While the embodiments here have been described with reference to the thin-film magnetic head of the structure wherein the reproducing head is located on the substrate side and the recording head is stacked on the reproducing head, it is contemplated that that order of stacking could be reversed. When the thin-film magnetic head here is used as a read-only head, the recording head could be removed from it.

SPECIFIC EXPERIMENTS

The magneto-resistive effect device of the invention is now explained in further details with reference to some specific experiments.

Experimental Example 1

An experimental sample (the sample of Example 1) of the magneto-resistive effect device of such construction as shown in FIGS. 1 and 2 was prepared.

That is, as set out in Table 1 given below, the magneto-resistive effect unit 8 of such multilayer construction as enumerated in Table 1 was formed on the first shield layer 3 made of NiFe and having a width of 30 μm (the X-axis direction size), a length of 3 μm (the Y-axis direction size) and a thickness of 100 nm (the Z-axis direction size). Then, there was the second shield layer 5 formed on that magneto-resistive effect unit 8, which layer was made of NiFe and had a width of 30 μm (the X-axis direction size), a length of 3 μm (the Y-axis direction size) and a thickness of 100 nm (the Z-axis direction size). Both sides of the magneto-resistive effect unit 8 were insulated off by alumina.

The first 3, and the second shield layer 5 was allowed to have a single domain structure by shape anisotropy due to the aforesaid sizes, and the magnetizations of the respective layers 3 and 5 were in antiparallel directions, as shown in FIGS. 1 and 2.

In the arrangement shown in Table 1, the magnetization 35 of the first shield layer 3 is antiferromagnetically coupled to the magnetization 111a of the gap adjustment layer 111, and the magnetization 111a of the gap adjustment layer 111 is antiferromagnetically coupled to the magnetization 135 of the first ferromagnetic layer 130, as shown in FIG. 2. The magnetization 51 of the second shield layer 5 is anti-ferromagnetically coupled to the magnetization 115a of the gap adjustment layer 115, and the magnetization 115a of the gap adjustment layer 115 is antiferromagnetically coupled to the magnetization 151 of the second ferro-magnetic layer 150, as shown in FIG. 2.

Using the magneto-resistive effect of the thus formed Example 1 sample, a signal magnetic field was detected from a medium corresponding to −400 Oe to 400 Oe. As a result, it has been confirmed that viable magnetic resistance changes are obtainable.

TABLE 1

| Multilayer Structure | | | Layer Material | Thickness (nm) |
|---|---|---|---|---|
| | Second Shield Layer(5) | | NiFe | 100 |
| Magneto-Resistive Effect Unit (8) | Second Exchange Coupling Transfer Layer (500) | Exchange Coupling Transfer Layer (105) | Ru | 0.8 |
| | | Gap Adjustment Layer (115) | CoFe | 4.0 |
| | | Exchange Coupling Adjustment Layer (125) | Cu | 0.9 |
| | Sensor Area | Second Ferromagnetic Layer (150) | CoFe | 3.0 |
| | | Nonmagnetic Intermediate Layer (140) | Cu | 0.5 |
| | | | ZnO | 1.8 |
| | | | Cu | 0.5 |
| | | First Ferromagnetic Layer (130) | CoFe | 3.0 |
| | First Exchange Coupling Gap Layer (300) | Exchange Coupling Transfer Layer (121) | Cu | 0.9 |
| | | Gap Adjustment Layer (111) | CoFe | 4.0 |
| | | Exchange Coupling Adjustment Layer (101) | Ru | 0.8 |
| | First Shield Layer (3) | | NiFe | 100 |

Experimental Example 2

In the Example 1 sample of the aforesaid Experimental Example 1, the material of which the non-magnetic intermediate layer 140 forming the sensor area was made was changed from the triple-layer structure of Cu (of 0.5 nm in thickness)/ZnO (of 1.8 nm in thickness)/Cu (of 0.5 nm in thickness) to MgO (of 0.8 nm in thickness).

In otherwise the same way as in the aforesaid Example 1, an experimental sample (Example 2 sample) of the magneto-resistive effect device was prepared.

Using the magneto-resistive effect of the thus formed Example 2 sample, a signal magnetic field was detected from a medium corresponding to −400 Oe to 400 Oe. As a result, it has been confirmed that viable magnetic reluctance changes are obtainable.

Experimental Example 3

In the Example 1 sample of the aforesaid Experimental Example 1, the multilayer construction of the first 300, and the second exchange coupling gap layer 500 was changed as enumerated in Table 2 given below to prepare an experimental sample (Example 3 sample) of the magneto-resistive effect device as embodied in FIG. 10.

In the construction enumerated in Table 2, the magnetization 35 of the first shield layer 3 is antiferromagnetically coupled to the magnetization 111a of the gap adjustment layer 111, the magnetization 111a of the gap adjustment layer 111 is antiferromagnetically coupled to the magnetization 112b of the gap adjustment layer 112, and the magnetization 112b of the gap adjustment layer 112 is antiferromagnetically coupled to the magnetization 135 of the first ferromagnetic layer 130, as shown in FIG. 10. Likewise, the magnetization 51 of the second shield layer 5 is antiferromagnetically coupled to the magnetization 115b of the gap adjustment layer 115, the magnetization 115b of the gap adjustment layer 115 is antiferromagnetically coupled to the magnetization 116a of the gap adjustment layer 116, and the magnetization 116a of the gap adjustment layer 116 is antiferromagnetically coupled to the magnetization 151 of the second ferromagnetic layer 150.

In this Example 3 sample, (1) two ferromagnetic layers, say, the gap adjustment layers 111 and 112 have the matching quantity of magnetization Mst and are strongly antiferromagnetically coupled to each other, and (2) two ferromagnetic layers, say, the gap adjustment layers 115 and 116 have the matching quantity of magnetization Mst and are strongly antiferromagnetically coupled to each other.

Using the magneto-resistive effect of the thus formed Example 3 sample, a signal magnetic field was detected from a medium corresponding to −400 Oe to 400 Oe. As a result, it has been confirmed that viable magnetic resistance changes are obtainable.

TABLE 2

| Multilayer Structure | | | Layer Material | Thickness (nm) |
|---|---|---|---|---|
| | Second Shield Layer (5) | | NiFe | 100 |
| Magneto-Resistive Effect Unit (8) | Second Exchange Coupling | Exchange Coupling Transfer Layer (105) | Ru | 0.8 |
| | Gap Layer (500) | Gap Adjustment Layer (115) | CoFe | 2.0 |
| | | Exchange Coupling Transfer Layer (106) | Ru | 0.8 |
| | | Gap Adjustment Layer (116) | CoFe | 2.0 |
| | | Exchange Coupling Adjustment Layer (125) | Cu | 0.9 |
| | Sensor Area | Second Ferromagnetic Layer (150) | CoFe | 3.0 |
| | | Nonmagnetic Intermediate Layer (140) | Cu | 0.5 |
| | | | ZnO | 1.8 |
| | | | Cu | 0.5 |
| | | First Ferromagnetic Layer (130) | CoFe | 3.0 |
| | First Exchange Coupling | Exchange Coupling Transfer Layer (121) | Cu | 0.9 |
| | Gap Layer (300) | Gap Adjustment Layer (112) | CoFe | 2.0 |
| | | Exchange Coupling Transfer Layer (102) | Ru | 0.8 |
| | | Gap Adjustment Layer (111) | CoFe | 2.0 |
| | | Exchange Coupling Adjustment Layer (101) | Ru | 0.8 |
| | First Shield Layer (3) | | NiFe | 100 |

From the aforesaid results, the advantages of the invention would be undisputed.

That is, the present invention provides a magneto-resistive effect device of the CPP (current perpendicular to plane) structure, comprising a magneto-resistive effect unit, and a first shield layer and a second shield layer located and formed such that the magneto-resistive effect unit is sandwiched between them, with a sense current applied in a stacking direction, wherein said magneto-resistive effect unit comprises a nonmagnetic intermediate layer, and a first ferromagnetic layer and a second ferromagnetic layer stacked and formed such that said nonmagnetic intermediate layer is interposed between them, wherein said first shield layer, and said second shield layer is controlled by magnetization direction control means in terms of magnetization direction, and said first ferromagnetic layer, and said second ferromagnetic layer receives action such that there is an antiparallel magnetization state created, in which mutual magnetizations are in opposite directions, under the influences of magnetic actions of said first shield layer and said second shield layer. It is thus possible to achieve an antiparallel magnetization state for two ferromagnetic layers (free layers) with simple structure yet without being restricted by the material and specific structure of an intermediate film interposed between the two ferromagnetic layers (free layers). Further, it is possible to make improvements in linear recording densities by the adoption of a structure capable of making the "read gap length" (the gap between the upper and lower shield layers) short (narrow) thereby meeting recent demands for ultra-high recording densities. Furthermore, it is possible to obtain stable magneto-resistive effect changes so that much higher reliability is achievable.

INDUSTRIAL APPLICABILITY

The present invention could be applied to the industry of magnetic disk systems comprising a magneto-resistive effect device operable to read the magnetic field intensity of magnetic recording media or the like as signals.

What we claim is:

1. A magneto-resistive effect device of a CPP (current perpendicular to plane) structure, comprising a magneto-resistive effect unit, and a first shield layer and a second shield layer located and formed such that the magneto-resistive effect unit is sandwiched between them, with a sense current applied in a stacking direction, wherein
said magneto-resistive effect unit comprises a non-magnetic intermediate layer, and a first ferromagnetic layer and a second ferromagnetic layer stacked and formed such that said non-magnetic intermediate layer is interposed between them,
said first shield layer and said second shield layer are controlled by magnetization direction control means in terms of magnetization direction, and
said first ferromagnetic layer and said second ferromagnetic layer receive magnetic actions such that there is an antiparallel magnetization state created, in which mutual magnetizations are in opposite directions, under influences of magnetic actions of said first shield layer and said second shield layer.

2. The magneto-resistive effect device according to claim 1, wherein said first ferromagnetic layer is magnetically coupled to said first shield layer having a controlled magnetization direction indirectly via a first exchange coupling function gap layer, and
said second ferromagnetic layer is magnetically coupled to said second shield layer having a controlled magnetization direction indirectly via a second exchange coupling function gap layer.

3. The magneto-resistive effect device according to claim 2, wherein said first exchange coupling function gap comprises, in order from said first shield layer side, an exchange coupling transfer layer, a gap adjustment layer, and an exchange coupling adjustment layer, and
said second exchange coupling function gap layer comprises, in order from said second shield layer side, an exchange coupling transfer layer, a gap adjustment layer, and an exchange coupling adjustment layer.

4. The magneto-resistive effect device according to claim 3, wherein said exchange coupling transfer layer is made up of at least one material selected from a group consisting of Ru, Rh, Ir, Cr, Cu, Ag, Au, Pt, and Pd, said gap adjustment layer is made up of a ferro-magnetic material, and said exchange coupling adjustment layer is made up of at least one material selected from a group consisting of Ru, Rh, Ir, Cr, Cu, Ag, Au, Pt, and Pd.

5. The magneto-resistive effect device according to claim 1, wherein the magnetization direction control means for controlling a magnetization direction of said first shield layer and said second shield layer is defined by a shape anisotropy function of said first shield layer and said second shield layer, or an exchange coupling function from an antiferromagnetic material.

6. The magneto-resistive effect device according to claim 5, wherein said first shield layer and said second shield layer are allowed to have a single domain structure by said magnetization direction control means.

7. The magneto-resistive effect device according to claim 2, wherein said first exchange coupling function gap layer comprises, in order from said first shield layer side, an exchange coupling transfer layer, a gap adjustment layer, an exchange coupling transfer layer, a gap adjustment layer, and an exchange coupling adjustment layer, and said second exchange coupling function gap layer comprises, in order from said second shield layer side, an exchange coupling transfer layer, a gap adjustment layer, an exchange coupling transfer layer, a gap adjustment layer, and an exchange coupling adjustment layer.

8. The magneto-resistive effect device according to claim 1, wherein said nonmagnetic intermediate layer is made up of a triple-layer structure with ZnO located at the middle thereof.

9. A thin-film magnetic head comprising:
a plane in opposition to a recording medium, and
a magneto-resistive effect as recited in claim 1 that is located near said medium opposite the plane to detect a signal magnetic field from said recording medium.

10. A head gimbal assembly comprising:
a slider including a thin-film magnetic head as recited in claim 9 and located in such a way as to oppose the recording medium, and
a suspension adapted to resiliently support said slider.

11. A magnetic disk system, comprising:
a slider including a thin-film magnetic head as recited in claim 9 and located in such a way as to oppose the recording medium, and
a positioning device adapted to support and position said slider with respect to said recording medium.

\* \* \* \* \*